(12) United States Patent
Liao et al.

(10) Patent No.: US 8,658,487 B2
(45) Date of Patent: Feb. 25, 2014

(54) SEMICONDUCTOR DEVICE AND FABRICATION METHOD THEREOF

(75) Inventors: Duan-Quan Liao, Singapore (SG); Shih-Chieh Hsu, New Taipei (TW); Yi-Kun Chen, Singapore (SG); Ching-Hwa Tey, de Royale (SG)

(73) Assignee: United Microelectronics Corp., Hsinchu (TW)

( * ) Notice: Subject to any disclaimer, the term of this patent is extended or adjusted under 35 U.S.C. 154(b) by 64 days.

(21) Appl. No.: 13/298,395

(22) Filed: Nov. 17, 2011

(65) Prior Publication Data

US 2013/0130460 A1 May 23, 2013

(51) Int. Cl.
*H01L 21/336* (2006.01)

(52) U.S. Cl.
USPC .......................................... 438/199

(58) Field of Classification Search
USPC ......... 438/199, 229, 275, 369, 197, 294, 299;
257/368, E21.409, E29.242, E21.444;
227/368, E21.409, E29.242, E21.444
See application file for complete search history.

(56) References Cited

U.S. PATENT DOCUMENTS

| | | | |
|---|---|---|---|
| 4,490,209 A * | 12/1984 | Hartman | 438/695 |
| 5,892,282 A | 4/1999 | Hong | |
| 6,033,978 A * | 3/2000 | Fujii et al. | 438/621 |
| 6,096,659 A | 8/2000 | Gardner | |
| 6,177,303 B1 | 1/2001 | Schmitz | |
| 6,303,418 B1 | 10/2001 | Cha | |
| 6,458,684 B1 | 10/2002 | Guo | |
| 6,573,134 B2 | 6/2003 | Ma | |
| 6,583,012 B1 * | 6/2003 | Buynoski et al. | 438/275 |
| 6,960,416 B2 | 11/2005 | Mui | |
| 7,126,199 B2 | 10/2006 | Doczy | |
| 7,144,783 B2 | 12/2006 | Datta | |
| 7,148,548 B2 | 12/2006 | Doczy | |
| 7,153,784 B2 | 12/2006 | Brask | |
| 7,176,090 B2 * | 2/2007 | Brask et al. | 438/270 |
| 7,186,605 B2 | 3/2007 | Cheng | |
| 7,208,361 B2 | 4/2007 | Shah | |
| 7,217,611 B2 | 5/2007 | Kavalieros | |
| 7,355,281 B2 | 4/2008 | Brask | |
| 7,407,876 B2 | 8/2008 | Ishizaka | |
| 7,556,998 B2 | 7/2009 | Park | |
| 7,700,479 B2 | 4/2010 | Huang | |
| 7,923,321 B2 * | 4/2011 | Lai et al. | 438/230 |
| 7,985,690 B2 * | 7/2011 | Thei et al. | 438/706 |
| 8,048,733 B2 * | 11/2011 | Yeh et al. | 438/199 |
| 8,048,810 B2 * | 11/2011 | Tsai et al. | 438/703 |
| 8,193,050 B2 * | 6/2012 | Yu et al. | 438/199 |
| 8,283,222 B2 * | 10/2012 | Hsu et al. | 438/183 |
| 8,334,198 B2 * | 12/2012 | Chen et al. | 438/595 |
| 2005/0001267 A1 * | 1/2005 | Miyagawa et al. | 257/332 |
| 2005/0287746 A1 * | 12/2005 | Metz et al. | 438/287 |
| 2006/0024953 A1 | 2/2006 | Papa Rao | |
| 2006/0046448 A1 * | 3/2006 | Barns et al. | 438/585 |
| 2006/0065939 A1 * | 3/2006 | Doczy et al. | 257/412 |

(Continued)

*Primary Examiner* — Michele Fan
(74) *Attorney, Agent, or Firm* — Ding Yu Tan

(57) ABSTRACT

A method for fabricating a semiconductor device comprises steps as follows: A first dummy gate having a first high-k gate insulator layer, a first composite sacrificial layer, and a first dummy gate electrode sequentially stacked on a substrate is firstly provided. The first dummy gate electrode is subsequently removed to expose the first composite sacrificial layer. The first composite sacrificial layer is then removed. Thereafter, a first work function layer is formed on the first high-k gate insulator layer, and a first metal gate electrode is formed on the first work function layer.

10 Claims, 22 Drawing Sheets

(56) References Cited

U.S. PATENT DOCUMENTS

| | | |
|---|---|---|
| 2007/0145591 A1 | 6/2007 | Yano |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2009/0026553 A1* | 1/2009 | Bhuwalka et al. ............ 257/402 |
| 2009/0039433 A1* | 2/2009 | Yang et al. .................... 257/365 |
| 2009/0057769 A1 | 3/2009 | Wei |
| 2009/0181504 A1* | 7/2009 | Lin et al. ....................... 438/199 |
| 2009/0186458 A1 | 7/2009 | Yu |
| 2009/0242980 A1* | 10/2009 | Inoue ........................... 257/334 |
| 2010/0044783 A1 | 2/2010 | Chuang |
| 2010/0065926 A1 | 3/2010 | Yeh |
| 2010/0068877 A1 | 3/2010 | Yeh |
| 2010/0087055 A1 | 4/2010 | Lai |
| 2010/0124818 A1 | 5/2010 | Lee |
| 2010/0244141 A1 | 9/2010 | Beyer |
| 2011/0001194 A1* | 1/2011 | Hou et al. ..................... 257/369 |
| 2011/0081774 A1* | 4/2011 | Yeh et al. ...................... 438/591 |
| 2011/0127589 A1* | 6/2011 | Chen et al. .................... 257/288 |
| 2011/0159678 A1* | 6/2011 | Hsu et al. ...................... 438/587 |
| 2011/0189847 A1* | 8/2011 | Tsai et al. ...................... 438/595 |
| 2011/0195550 A1* | 8/2011 | Chang et al. .................. 438/230 |
| 2011/0248359 A1* | 10/2011 | Hwang et al. ................. 257/410 |
| 2011/0256682 A1* | 10/2011 | Yu et al. ........................ 438/287 |
| 2011/0303982 A1* | 12/2011 | Chung et al. .................. 257/363 |
| 2012/0012938 A1* | 1/2012 | Chen et al. .................... 257/369 |
| 2012/0052641 A1* | 3/2012 | Lee et al. ....................... 438/270 |
| 2012/0098043 A1* | 4/2012 | Hsieh et al. ................... 257/288 |
| 2012/0139053 A1* | 6/2012 | Ando et al. ................... 257/369 |
| 2012/0175711 A1* | 7/2012 | Ramachandran et al. .... 257/383 |
| 2012/0225545 A1* | 9/2012 | Fu et al. ........................ 438/585 |
| 2012/0248509 A1* | 10/2012 | Guo et al. ..................... 257/288 |
| 2012/0256275 A1* | 10/2012 | Huang et al. .................. 257/410 |
| 2012/0286375 A1* | 11/2012 | Cai et al. ....................... 257/412 |
| 2012/0319214 A1* | 12/2012 | Ma et al. ....................... 257/410 |
| 2012/0322246 A1* | 12/2012 | Wang et al. ................... 438/488 |
| 2013/0005097 A1* | 1/2013 | Xu et al. ........................ 438/229 |

* cited by examiner

SEMICONDUCTOR DEVICE AND FABRICATION METHOD THEREOF

FIELD OF THE INVENTION

The present invention relates to a method for fabricating a semiconductor device and the fabricating method thereof, more particularly to a method for fabricating a field effect transistor (FET) with metal gates.

BACKGROUND OF THE INVENTION

With the development of the electrical technology, a FET, such as a complementary metal-oxide semiconductor (CMOS) transistor, with high integrity and operation speed is required. As each technology nodes shrink, the dimensions of a CMOS and the thickness of its gate oxide, however, must be reduced and gate leakage could be more likely triggered by the reduced gate length.

In order to reduce gate leakage, high dielectric constant (high-k) gate insulator layers are used and the conventional dummy gate electrode is replaced with a metal gate (MG) electrode to improve the device performance as the feature sizes has being decreased.

The conventional technique for fabricating a metal gate CMOS transistor includes the following steps: Firstly a CMOS transistor including a PMOS and an NMOS each having a poly-silicon dummy gate electrode is formed. After the CMOS transistor is completed, the dummy gate electrodes of the NMOS and the PMOS will be removed by an etching process. Subsequently, various work function layers and two MG electrodes are successively deposited in the region where the dummy gate electrodes of the NMOS and the PMOS were originally located, while the metal gate CMOS transistor is formed.

Because NMOS and the PMOS require different work function layers with diverse work function values, and the different work function layers may interference with each other, thus an etching process is performed by the prior art to remove the portion of the PMOS's work function layer which is deposited on the NMOS before the NMOS's work function layer is deposited, and thus an etching stop layer consisting of tantalum nitride (TaN) deposited under the PMOS's work function layer is provided to protect the underlying high-k gate insulator layer from being damaged by the etching process.

However, since the TaN may adversely affect the performance of the PMOS's work function layer, thus the thickness of the etching stop layer should be minimized, and is always a trade-off between the etching residue and the etching stop layer punch through. Therefore, it is necessary to provide an advanced semiconductor device and the fabrication method thereof to obviate the drawbacks and problems encountered from the prior art.

SUMMARY OF THE INVENTION

One aspect of the present invention is to provide a method for fabricating a semiconductor device, wherein the method comprises steps as follows: A first dummy gate having a first high-k gate insulator layer, a first composite sacrificial layer, and a first dummy gate electrode sequentially stacked on a substrate is firstly provided. The first dummy gate electrode is subsequently removed to expose the first composite sacrificial layer. The first composite sacrificial layer is then removed. Thereafter, a first work function layer is formed on the first high-k gate insulator layer, and a first metal gate electrode is formed on the first work function layer.

In one embodiment of the present invention, the method for fabricating the semiconductor device further comprises the following steps: A second dummy gate is provided simultaneously with the provision of the first dummy gate, wherein the second dummy gate has a second high-k gate insulator layer, a second composite sacrificial layer, and a second dummy gate electrode sequentially stacked on the substrate, and the second dummy gate electrode is subsequently removed simultaneously with the step of removing the first composite sacrificial layer to expose the second composite sacrificial layer.

In one embodiment of the present invention, the method for fabricating the semiconductor device further comprises steps of forming a first patterned photo-resist layer to cover the exposed second composite sacrificial layer, before the first composite sacrificial layer is removed.

In one embodiment of the present invention, the formation of the first work function layer is carried out after the first patterned photo-resist layer is removed; thereby the exposed second composite sacrificial layer is covered by the first work function layer.

In one embodiment of the present invention, after the first work function layer is formed, the method for fabricating the semiconductor device further comprises the following steps: A second patterned photo-resist layer is formed to cover a portion of the first work function layer which covers the first high-k gate insulator layer. An etching process is then performed to remove the uncovered portion of the first work function layer and the second composite sacrificial layer. A second work function layer is then formed on the first high-k gate insulator layer and the second high-k gate insulator layer, after the second patterned photo-resist layer is removed. A second metal gate electrode is subsequently formed on the second work function layer simultaneously with the formation of the first metal gate electrode.

In one embodiment of the present invention, the first work function layer is made of titanium nitride (TiN) and the second work function layer is made of titanium-aluminum alloy (TiAl).

In one embodiment of the present invention, the first composite sacrificial layer and the second composite sacrificial layer both comprise a patterned silicon-containing sacrificial layer and a patterned metal nitride sacrificial layer, wherein the patterned silicon-containing sacrificial layer formed on the first high-k gate insulator layer and the second high-k gate insulator layer; and the patterned metal nitride sacrificial layer is formed on the patterned silicon-containing sacrificial layer.

In one embodiment of the present invention, the metal nitride sacrificial layer is made of TiN or tantalum nitride (TaN).

In one embodiment of the present invention, the first dummy gate and the second dummy gate further comprise a patterned TiN capping layer formed beneath the patterned silicon-containing sacrificial layer and over the first high-k gate insulator layer and the second high-k gate insulator layer.

In one embodiment of the present invention, the step of removing the first composite sacrificial layer comprises steps of applying an ammonia-containing agent to remove a portion of the patterned metal nitride sacrificial layer, whereby the portion of the patterned silicon-containing sacrificial layer overlaying on the first high-k gate insulator layer is exposed; and applying a chloride-containing agent to remove the exposed portion of the patterned silicon-containing sacrificial layer.

In one embodiment of the present invention, the method for fabricating the semiconductor device further comprises steps of using the first dummy gate and the second dummy gate as a mask to form a first source/drain structure and a second source/drain structure in the substrate and respectively adjacent to the first dummy gate and the second dummy gate.

Another aspect of the present invention is to provide a method for fabricating a semiconductor device, wherein the method comprises steps as follows: A first metal-oxide semiconductor (MOS) transistor having a first dummy gate electrode disposed on a substrate is firstly provided. The first dummy gate electrode is then removed, and a first high-k gate insulator layer and a first composite sacrificial layer are then formed and sequentially stacked on the location where the first dummy gate electrode is initially disposed. The first composite sacrificial layer is subsequently removed. A first work function layer is then formed on the first high-k gate insulator layer; and a first metal gate electrode is then formed on the first work function layer.

In one embodiment of the present invention, the method for fabricating the semiconductor device further comprises steps as follows: A second MOS transistor having a second dummy gate electrode disposed on the substrate is provided simultaneously with the provision of the first MOS transistor, and the second dummy gate electrode is then removed simultaneously with the step of removing the first dummy gate electrode. Subsequently, a second high-k gate insulator layer and a second composite sacrificial layer sequentially stacked on the location where the second dummy gate electrode is initially disposed are formed simultaneously with the formation of the first high-k gate insulator layer and the first composite sacrificial layer.

In one embodiment of the present invention, the method for fabricating the semiconductor device further comprises steps of forming a first patterned photo-resist layer to cover the second composite sacrificial layer, before the first composite sacrificial layer is removed.

In one embodiment of the present invention, the formation of the first work function layer is carried out after the first patterned photo-resist layer is removed; thereby the exposed second composite sacrificial layer is covered by the first work function layer.

In one embodiment of the present invention, after the first work function layer is formed, the method for fabricating the semiconductor device further comprises the following steps: A second patterned photo-resist layer is formed to cover the portion of the first work function layer which covers the first high-k gate insulator layer. Subsequently, an etching process is performed to remove the uncovered portion of the first work function layer and the second composite sacrificial layer. After the second patterned photo-resist layer is removed, a second work function layer is formed on the first high-k gate insulator layer and the second high-k gate insulator layer. A second metal gate electrode is then formed on the second work function layer simultaneously with the formation of the first metal gate electrode.

In one embodiment of the present invention, the first composite sacrificial layer and the second composite sacrificial layer both comprise a patterned silicon-containing sacrificial layer and a patterned metal nitride sacrificial layer, wherein the patterned silicon-containing sacrificial layer is formed on the first high-k gate insulator layer and the second high-k gate insulator layer, and the patterned metal nitride sacrificial layer is formed on the patterned silicon-containing sacrificial layer.

In one embodiment of the present invention, the metal nitride sacrificial layer is made of TiN or tantalum nitride (TaN).

In one embodiment of the present invention, the first MOS transistor and the second MOS transistor further comprise a patterned TiN capping layer disposed beneath the patterned silicon-containing sacrificial layer and over the first high-k gate insulator layer and the second high-k gate insulator layer.

In one embodiment of the present invention, the step of removing the first composite sacrificial layer comprises steps of applying an ammonia-containing agent to remove a portion of the patterned metal nitride sacrificial layer, whereby the portion of the patterned silicon-containing sacrificial layer overlaying on the first high-k gate insulator layer is exposed, and applying a chloride-containing agent to remove the exposed portion of the patterned silicon-containing sacrificial layer.

Further another aspect of the present invention is to provide a method for fabricating a CMOS transistor, wherein the method comprises steps as follows:

a first dummy gate having a first high-k gate insulator layer, a first composite sacrificial layer, and a first dummypolysilicon gate electrode sequentially stacked on an N well region of a substrate is provided; and a second dummy gate is provided simultaneously with the provision of the first dummy gate, wherein the second dummy gate has a second high-k gate insulator layer, a second composite sacrificial layer, and a second dummy gate electrode sequentially stacked on a P well region of the substrate. Subsequently, the first dummy gate electrode and the second dummy gate electrode are removed to expose the first composite sacrificial layer and the second composite sacrificial layer. A first patterned photo-resist layer is then formed to cover the exposed second composite sacrificial layer. Next, the first composite sacrificial layer is removed to expose the first high-k gate insulator layer. After the first patterned photo-resist layer is removed, a first work function layer is then formed on the first high-k gate insulator layer and the exposed second composite sacrificial layer. Thereafter, a second patterned photo-resist layer is formed to cover the portion of the first work function layer which covers the first high-k gate insulator layer and an etching process is then performed to remove the uncovered portion of the first work function layer and the second composite sacrificial layer. A second work function layer is subsequently formed on the first high-k gate insulator layer and the second high-k gate insulator layer, after the second patterned photo-resist layer is removed. A first metal gate electrode and a second metal gate electrode are then formed respectively on the first work function layer and the second work function layer.

In accordance with the aforementioned embodiments of the present invention, a composite sacrificial layer formed on a high-k insulator layer is provided to take the place of the conventional TaN capping layer for fabricating a metal gate. The composite sacrificial layer not only can serve as an etching stop layer, like the conventional TaN capping layer does, to protect the high-k gate insulator layer of the NMOS from being damaged by an etching process but also can be removed during the metal gate fabricating process. In other words, the composite sacrificial layer functions as the conventional TaN capping layer but does not contribute any adverse effect. Accordingly, the drawbacks and problems encountered from the prior art can be avoided, and the device performance can be improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
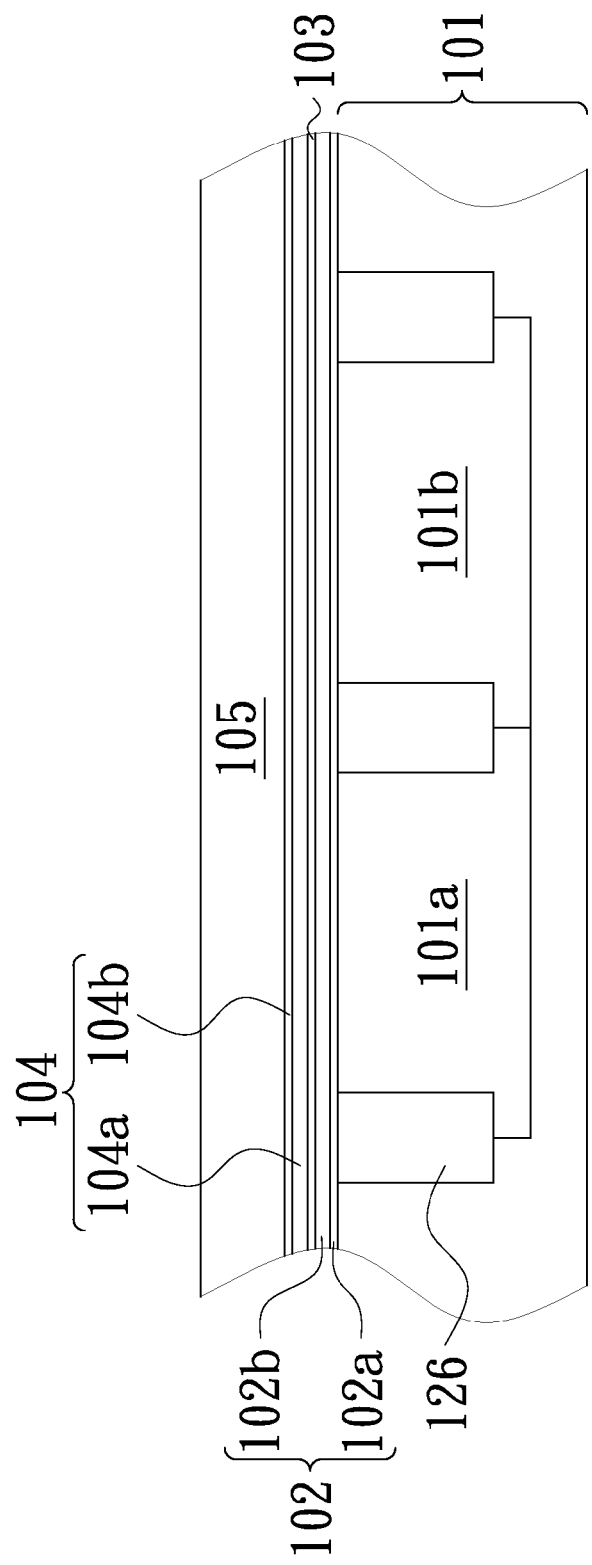
FIGS. 1A to 1K are cross-sectional views illustrating the method for fabricating a metal gate CMOS transistor in accordance with one embodiment of the present invention.

The present invention is to provide an advanced method for fabricating a semiconductor device having a metal gate transistor. The present invention will now be described more specifically with reference to the following embodiments. It is to be noted that the following descriptions of the preferred embodiments of this invention are presented herein for purpose of illustration and description only. It is not intended to be exhaustive or to be limited to the precise form disclosed.

FIGS. 1A to 1K are cross-sectional views illustrating the method for fabricating a metal gate CMOS transistor 100 in accordance with one embodiment of the present invention, wherein the method comprises steps as follows:

A substrate 101 having an N well region 101a and a P well region 101b is provided, where in the N well region 101a and the P well region 101b are defined by a plurality of shallow trench isolation (STI)126. A dielectric material layer 102, an optional capping layer 103, a composite sacrificial layer 104 and a dummy gate electrode layer 105 are then formed and sequentially stacked on the substrate 101 (see FIG. 1A).

In the present embodiment, the dielectric material layer 102 comprises an interfacial layer (IL) 102a and high-k dielectric layer 102b sequentially stacked on the substrate 101. The IL 102a is preferably made of silicon oxide ($SiO_2$), silicon nitride (SiN), silicon oxynitride (SiON) or silicon carbonitride (SiCN). The high-k dielectric layer 102b is preferably made of hafnium silicon, hafnium oxide, hafnium silicon oxide or hafnium silicon oxynitride. The capping layer 103 preferably is made of TiN.

The composite sacrificial layer 104 comprises a silicon-containing sacrificial layer 104a and a metal nitride sacrificial layer 104b, wherein the silicon-containing sacrificial layer 104a is formed on the capping layer 103, and the metal nitride sacrificial layer 104b is formed on the silicon-containing sacrificial layer 104a. The silicon-containing sacrificial layer 104a can be a poly silicon layer, an amorphous silicon layer or a doped silicon layer and preferably is a thin film poly silicon layer. The metal nitride sacrificial layer 104b preferably is made of TiN or TaN. The dummy gate electrode layer 105 can be made of poly silicon, amorphous silicon, doped silicon, silicon-germanium (SiGe) or other semiconductor material which can be easily removed at the subsequent etching process.

Figure 1B:
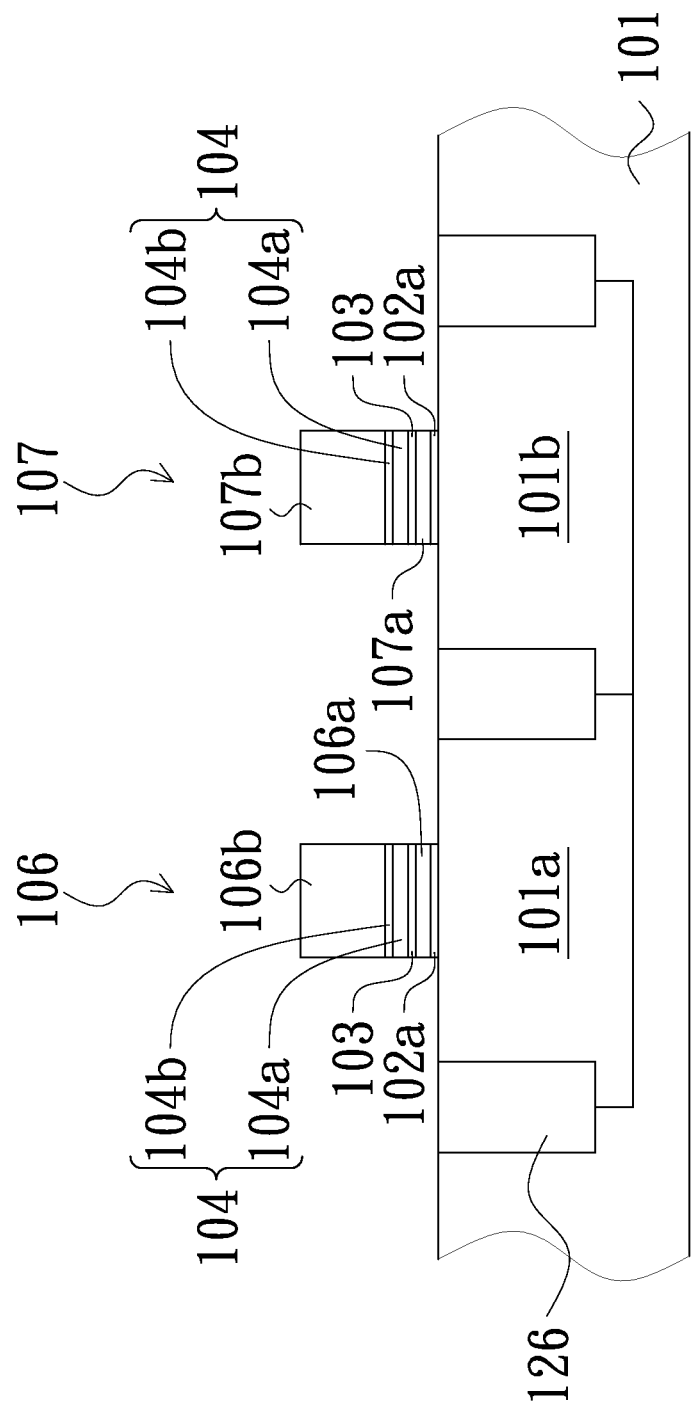
Figure 1C:
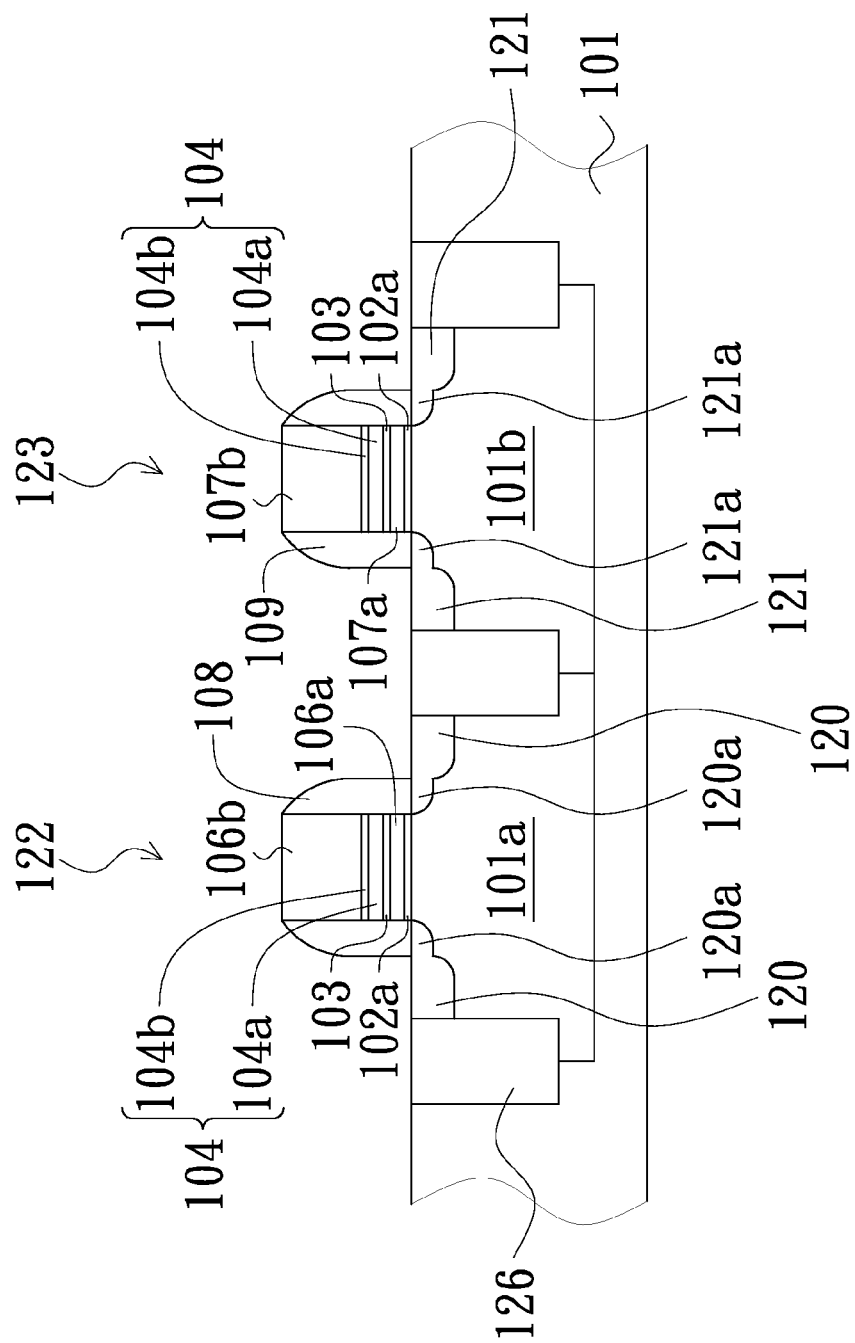

Next, the dielectric material layer 102, the capping layer 103, the composite sacrificial layer 104 and the dummy gate electrode layer 105 are patterned to form a dummy gate 106 stacked on the N well region 101a and another dummy 107 stacked on the P well region 101b (see FIG. 1B).

In the present embodiment, the dummy gate 106 stacked on the N well region 101a is composed of portions of the patterned IL 102a, the patterned high-k dielectric layer 102b (therein after is referred as the high-k insulator layer 106a), the patterned composite sacrificial layer 104 and the patterned dummy gate electrode layer 105 (therein after is referred as the dummy gate electrode 106b); and the dummy gate 107 stacked on the P well region 101b is composed of the remaining portions of the patterned IL 102a, the patterned high-k dielectric layer 102b (therein after is referred as the high-k insulator layer 107a), the patterned composite sacrificial layer 104 and the patterned dummy gate electrode layer 105 (therein after is referred as the dummy gate electrode 107b).

In some embodiments of the present invention, an optional dielectric layer (not shown) may be formed on the dummy gate electrode 106b and the dummy gate electrode 107b to serve as a hard mask. The hard mask preferably made of a oxide or nitride or a combination thereof.

Thereafter, a plurality of light doped drain (LDD) implant processes by using the dummy gates 106 and 107 as the masks are successively carried out, thereby two LDDs 120a and 121a are respectively formed in the N well region 101a and the P well region 101b respectively. Subsequently, spacers 108 and 109 are then formed on the sidewalls of the dummy gates 106 and 107 respectively. Next, a plurality of ion implantation processes by using the dummy gates 106 and 107 and the spacers 108 and 109 as the masks are successively carried out on the LDDs 120a and 121a, so as to respectively form a source/drain 120 in the N well region 101a and another source/drain 121 in the P well region 101b, and meanwhile a PMOS transistor 122 and an NMOS transistor 123 each having a dummy gate are formed on the substrate 101 (see FIG. 1C).

Figure 1D:
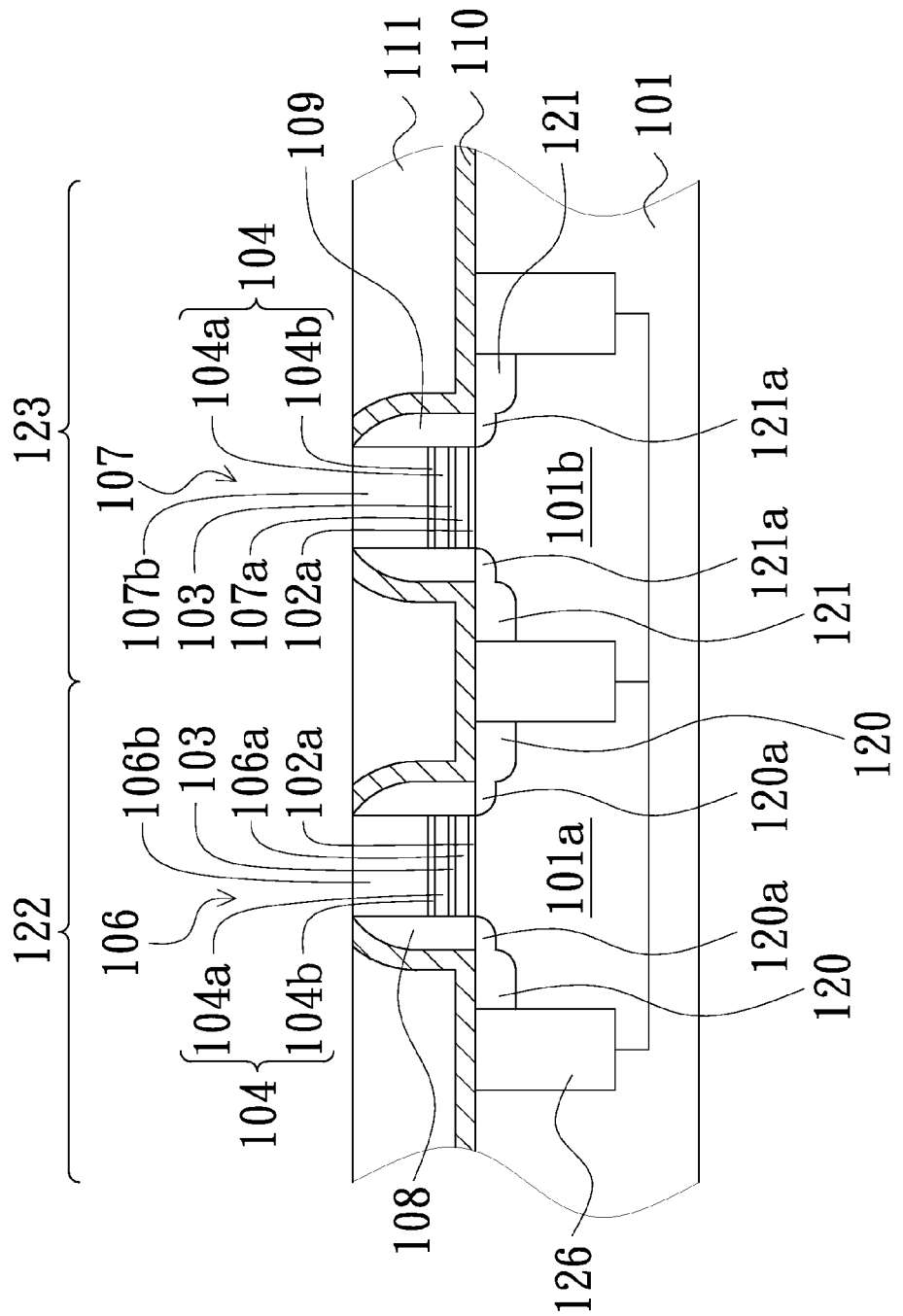

Subsequently, a contact etch stop layer (CESL) 110 and an interlayer dielectric (ILD) 111 are successively formed on the PMOS 122 and the NMOS 123, and then a series of chemical mechanical polishing (CMP) processes or etching processes by using the CESL 110 as a mask are performed to partially remove the CESL 110 and the ILD 111, thereby the dummy gate electrodes 106b and 107b are exposed (see FIG. 1D). In the present invention, the CESL 110 may be made of $SiO_2$, SiN, SiON or SiCN, preferably is a SiN multiple layer.

Figure 1E:
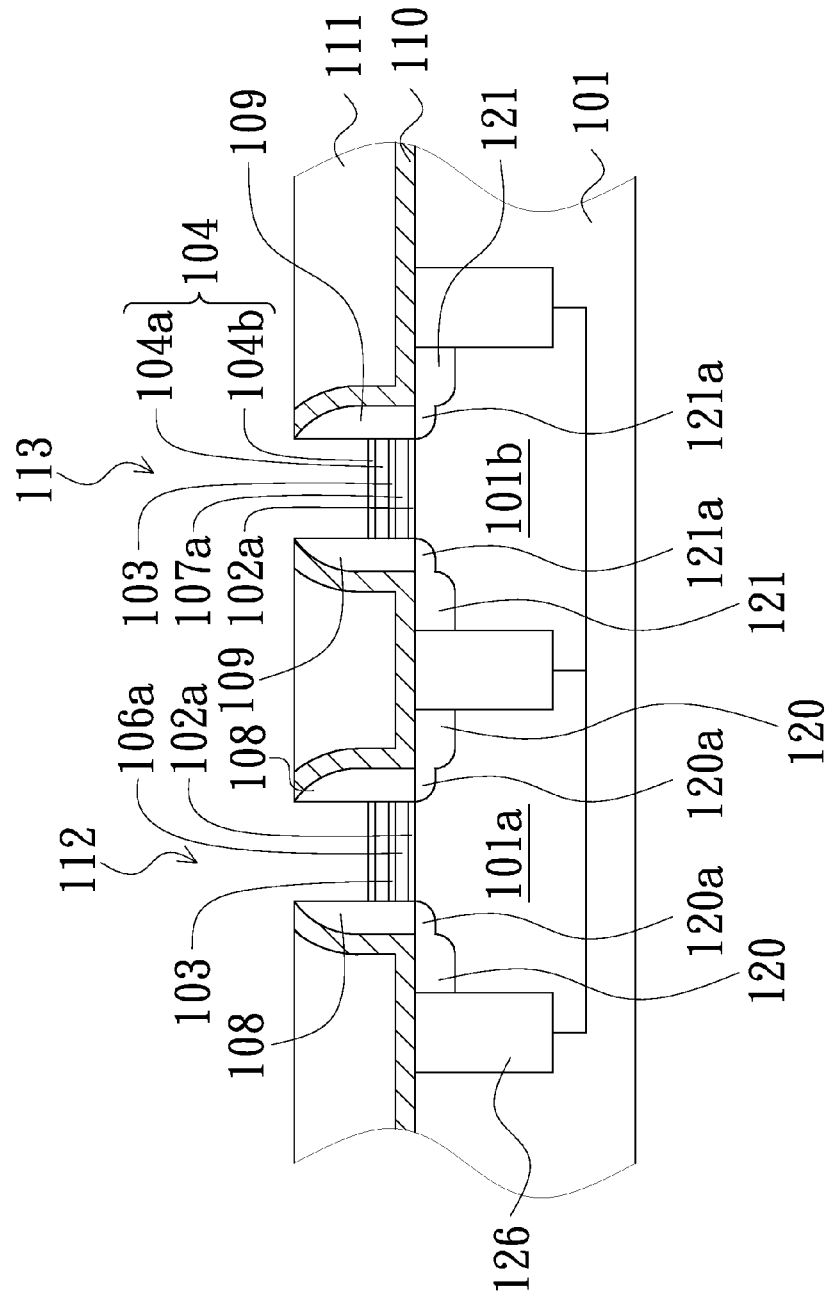

After that, an etching process is performed by using the metal nitride sacrificial layer 104b as an etching stop layer, to remove the dummy gate electrode 106b and 107b, whereby openings 112 and 113 are formed in the PMOS 122 and the NMOS 123 respectively, and the patterned metal nitride sacrificial layer 104b can be exposed there from (see FIG. 1E).

Figure 1F:
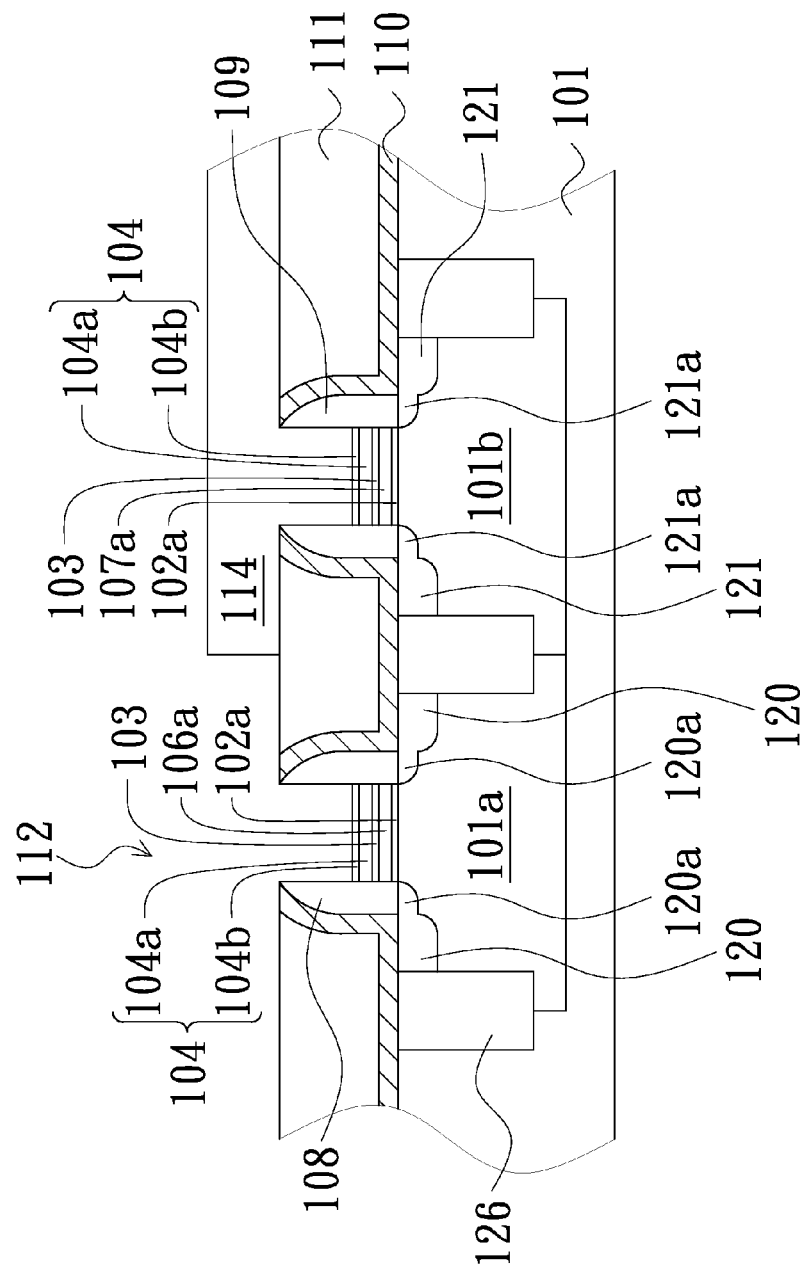
Figure 1G:
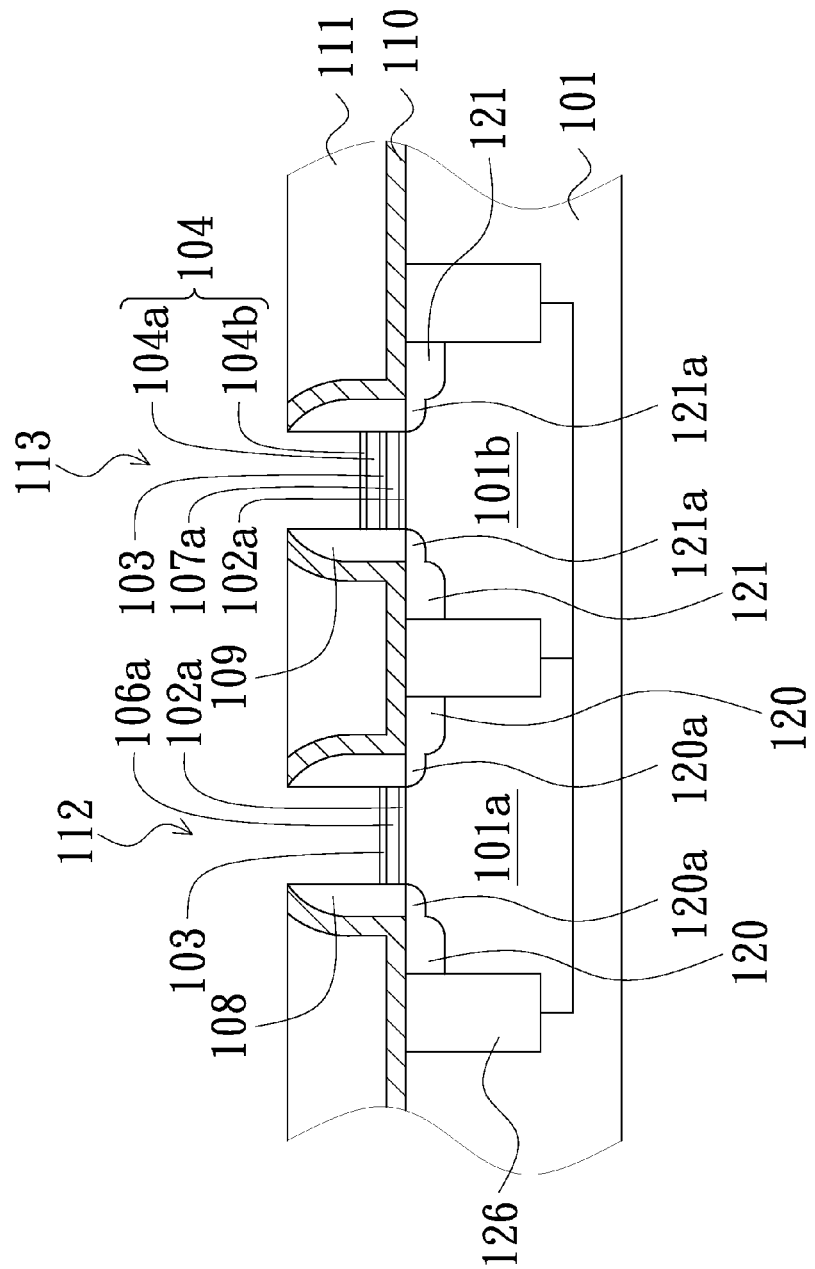

Next, a patterned photo-resist layer 114 is formed to cover the portion of the metal nitride sacrificial layer 104b exposed by the opening 113 (see FIG. 1F). A wet etching process is then performed to remove a portion of the composite sacrificial layer 104 exposed from the opening 112 and the patterned photo-resist layer 114 (see FIG. 1G).

In some embodiment of the present invention, the wet etching process comprises steps as follows: Firstly an ammonia-containing agent (preferably is SC1 solution including $NH_4OH$, $H_2O_2$ and $H_2O$) is applied to remove the portion the patterned metal nitride sacrificial layer 104b exposed from the opening 112, whereby the portion of the silicon-containing sacrificial layer 104a overlaying on the high-k insulator layer 106a is exposed from the opening 112. Subsequently, a photo-resist stripping agent (preferably is as Rezi-38 solution) is applied to remove the patterned photo-resist layer 114, thereby the portion of the metal nitride sacrificial layer 104b overlaying on the high-k insulator layer 107a is removed via the opening 113. A hydrogen chloride-containing agent (preferably is SC2 solution including HCl, $H_2O_2$ and $H_2O$) is then applied to remove the exposed portion of the silicon-containing sacrificial layer 104a, whereby the portion of the capping layer 103 overlaying on the first high-k insulator layer 106a is exposed from the opening 112.

However, since the capping layer 103 is optional, thus it should be appreciated that, in some embodiments of the present invention, the high-k insulator layer 106a may be exposed from the opening 112, when the exposed portion of the silicon-containing sacrificial layer 104a is removed.

Figure 1H:
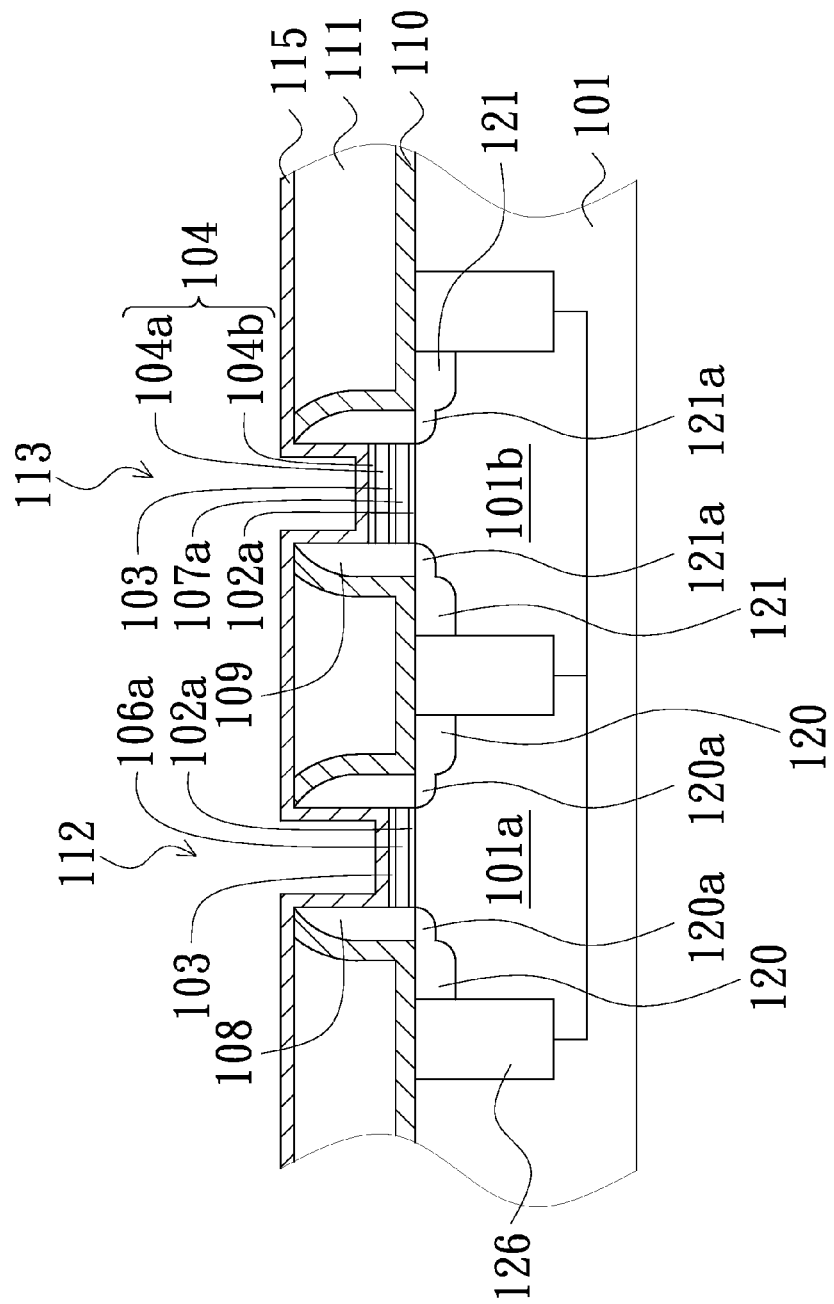
Figure 1I:
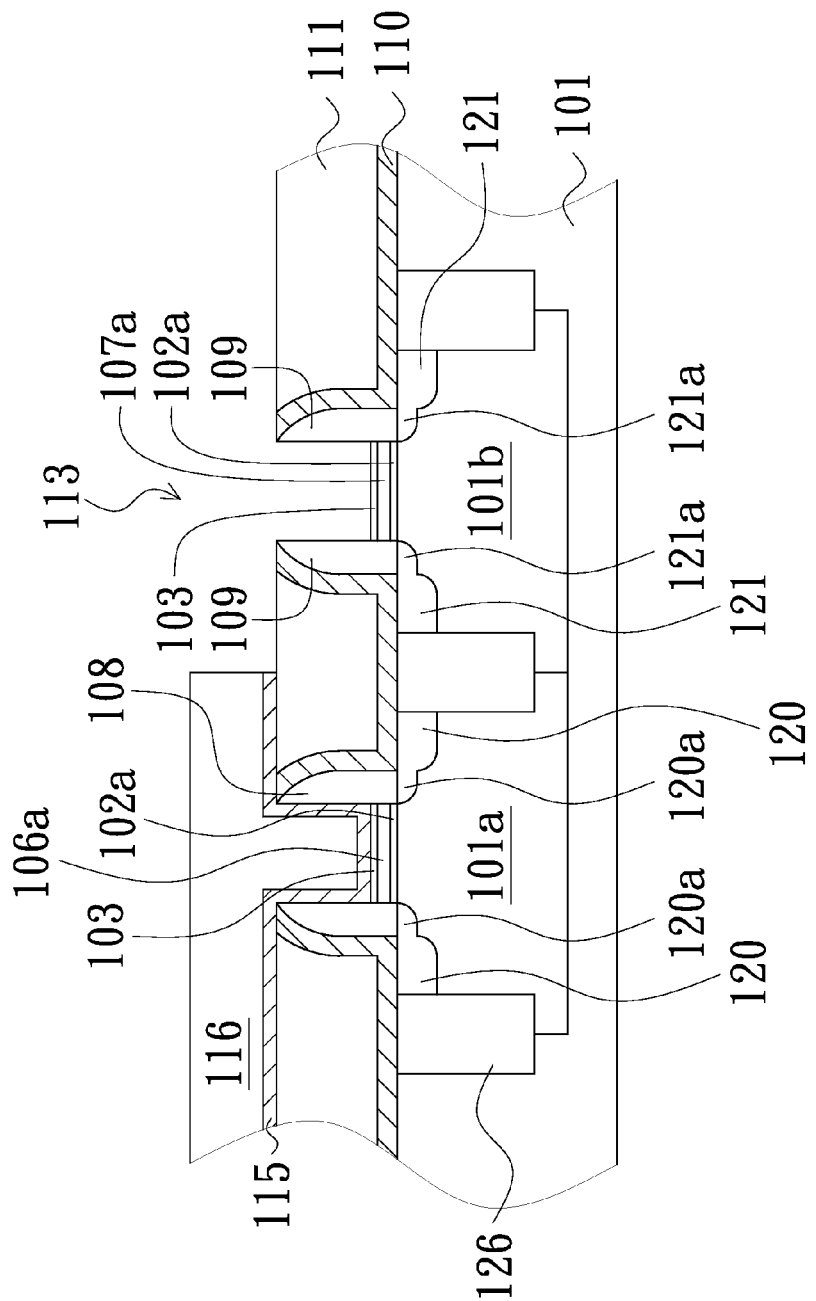

A metal deposition process is then performed to form a work-function layer 115 covering the bottom and the sidewalls of the openings 112 and 113, whereby the portion of the capping layer 103 exposed from the openings 112 and the portion of the metal nitride sacrificial layer 104b exposed from the openings 113 are blanketed by the work-function layer 115 (see FIG. 1H). In the present embodiment, the work-function layer 115 is suitable for serving as a PMOS work function layer or a mid-gate function layer, and preferably is a TiN layer.

After the work-function layer 115 is formed, another patterned photo-resist layer 116 is provided to cover the portion of the work function layer 115 which overlays on the high-k gate insulator layer 106a. Subsequently, an etching process is performed and stops at the capping layer 103 to remove the uncovered portion of the work function layer 115 and the portion of the composite sacrificial layer 104 beneath the uncovered portion of the work function layer 115, such that a portion of the capping layer 103 can be exposed from the opening 113 (see FIG. 1I).

After the patterned photo-resist layer 116 is stripped, another metal deposition process is then performed to form a work-function layer 117 covering the bottom and the sidewalls of the openings 112 and 113, whereby the remaining work function layer 115 and the portion of the capping layer 103 exposed from the opening 113 are blanketed by the work-function layer 117. In the present embodiment, the work-function layer 117 is suitable for serving as an NMOS work function layer or a mid-gate function layer, and preferably is an AlTi layer.

Figure 1J:
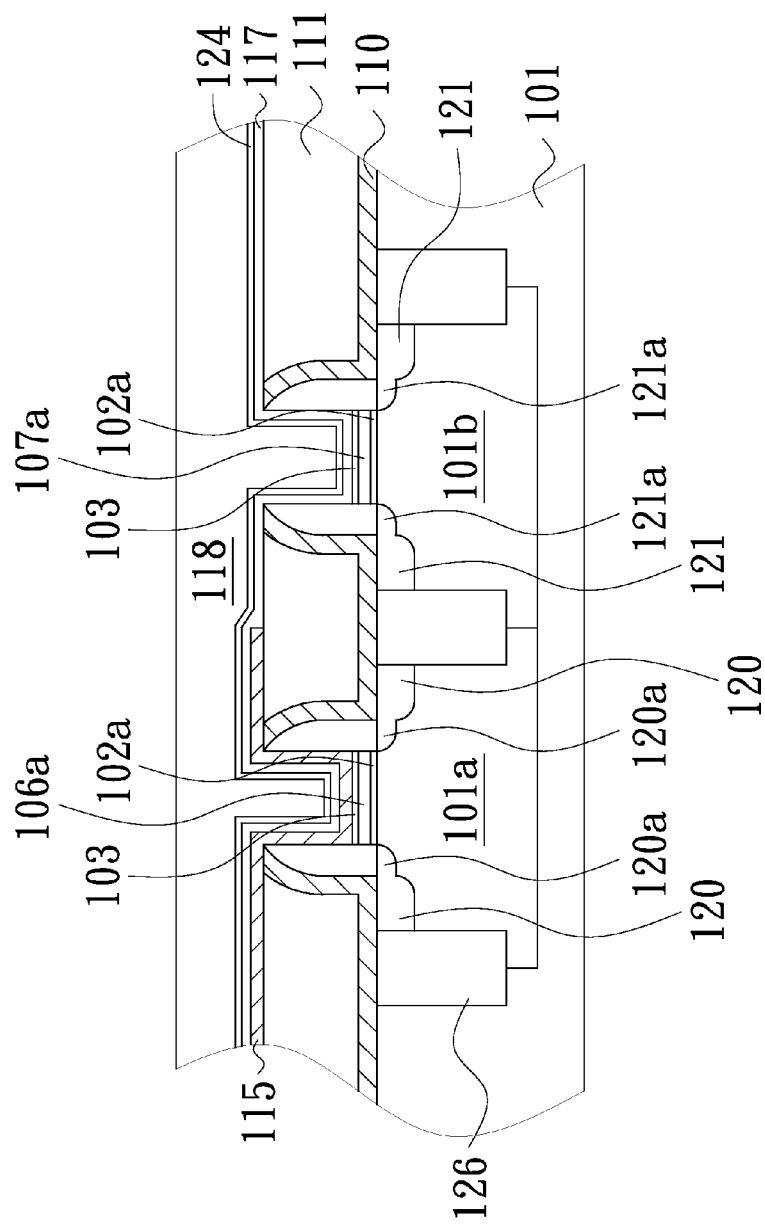
Figure 1K:
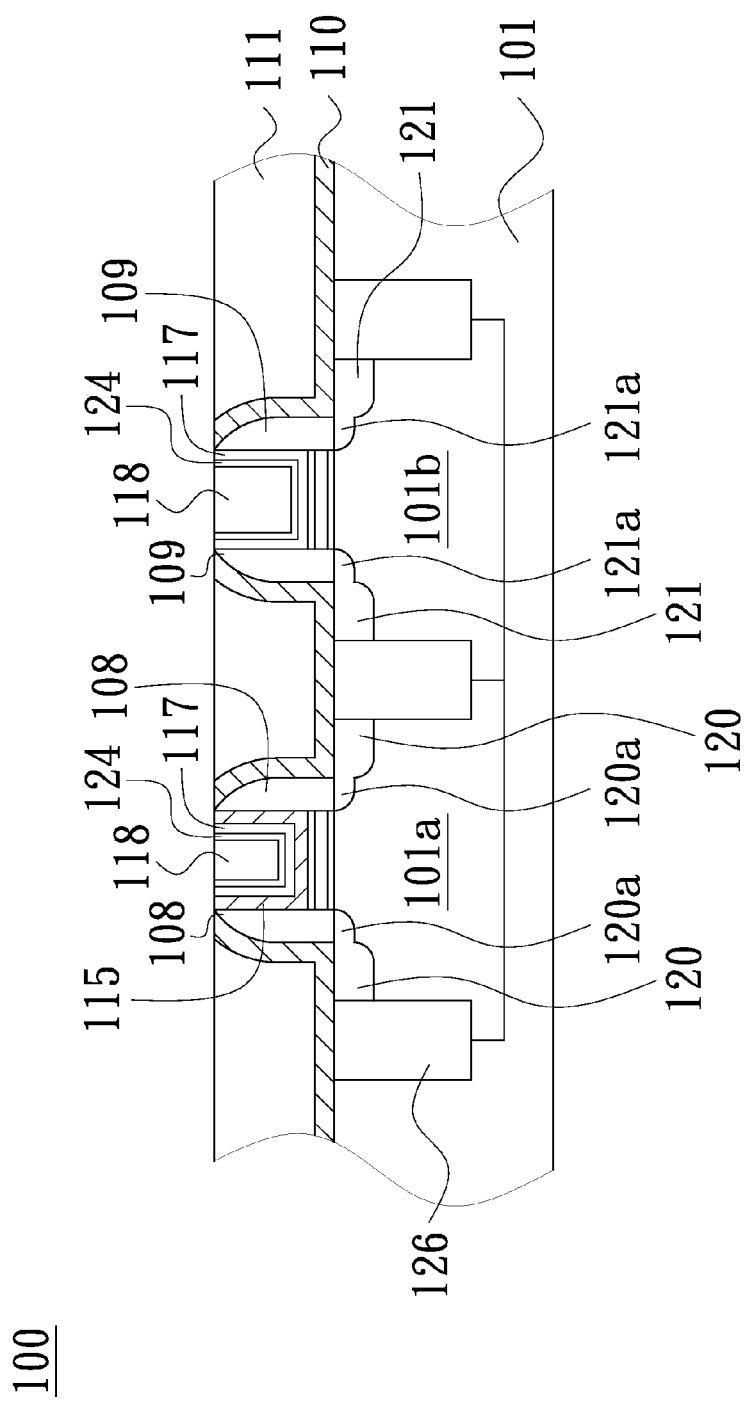

Next, an optional barrier metal layer 124(such as a TiN film) and a low-resistivity metal layer 118 (consisting of copper or AlTi or other metal material) are sequentially deposited on the work-function layer 117 and fills the openings 112 and 113 (see FIG. 1J). The metal layer 118, the barrier metal layer 124, the work-function layer 116 and the remaining work function layer 115 are then subjected to a metal planarizaition process (such as a CMP process), thereby two metal gates 118 and 119 are produced, meanwhile the metal gate CMOS transistor 100 shown as FIG. 1K is fabricated.

FIGS. 2A to 2K are cross-sectional views illustrating the method for fabricating a metal gate CMOS transistor 200 in accordance with another embodiment of the present invention, wherein the method comprises steps as follows:

A substrate 201 having an N well region 201a and a P well region 201b is provided, where in the N well region 201a and the P well region 201b are defined by a plurality of shallow trench isolation (STI)226. A dielectric material layer 225 and a dummy gate electrode layer 205 are then formed and sequentially stacked on the substrate 201. Next, the dielectric material layer 225, and the dummy gate electrode layer 205 are patterned, to form a dummy gate 206 stacked on the N well region 201a and another dummy gate 207 stacked on the P well region 201b (see FIG. 2A). In some embodiment of the present invention, the dummy gate electrode layer 205 can be made of poly silicon, amorphous silicon, doped silicon, silicon-germanium (SiGe) or other semiconductor material which can be easily removed at the subsequent etching process, and the dielectric material layer 225 is preferably made of $SiO_2$, SiN, SiON or SiCN.

In the present embodiment, the dummy gate 206 stacked on the N well region 201a is composed of a portion of the patterned dielectric layer 225 and a portion of the patterned dummy gate electrode layer 205 (therein after is referred as the dummy gate electrode 206a); and the dummy gate 207 stacked on the P well region 201b is composed of the remaining portions of the patterned dielectric layer 225 and the patterned dummy gate electrode layer 205 (therein after is referred as the dummy gate electrode 207a).

Subsequently, a plurality of light doped drain (LDD) implant processes by using the dummy gates 206 and 207 as the masks are successively carried out, thereby two LDDs 220a and 221a are respectively formed in the N well region 201a and the P well region 201b. Subsequently, spacers 208 and 209 are then formed on the sidewalls of the dummy gates 206 and 207 respectively. Next, a plurality of ion implantation processes by using the spacers 208 and 209 as the masks are successively carried out on the LDDs 220a and 221a, so as to form a source/drain 220 in the N well region 201a and another source/drain 221 in the P well region 201b, and meanwhile a PMOS transistor 222 and an NMOS transistor 223 each having a dummy gate are formed on the substrate 201 (see FIG. 2B).

In some embodiments of the present invention, an optional dielectric layer (not shown) may be formed on the dummy gate electrode 206a and the dummy gate electrode 207a to serve as a hard mask. The hard mask preferably made of a oxide or nitride or a combination thereof.

Figure 2A:
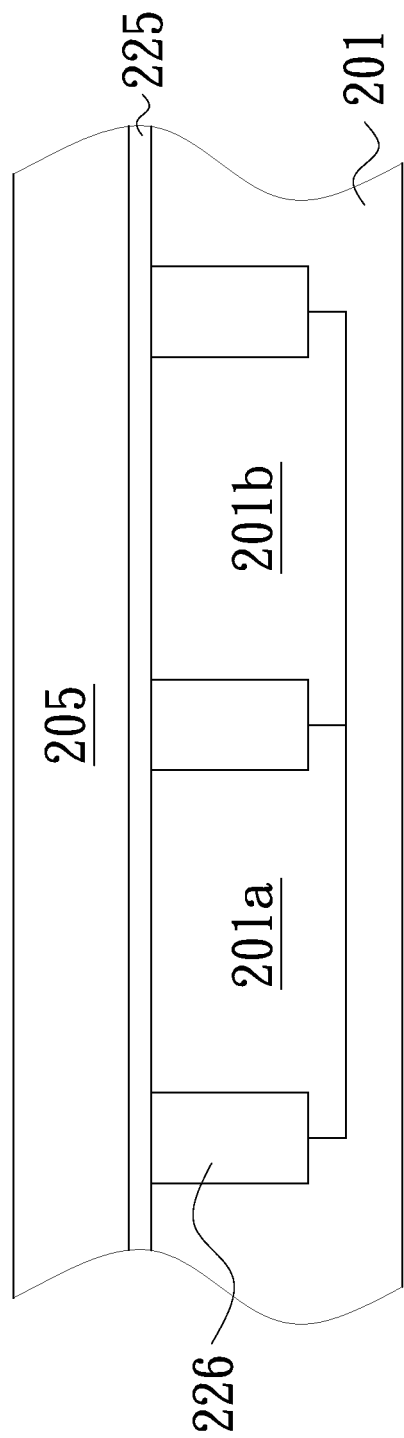
FIGS. 2A to 2K are cross-sectional views illustrating the method for fabricating a metal gate CMOS transistor in accordance with another embodiment of the present invention.
Figure 2B:
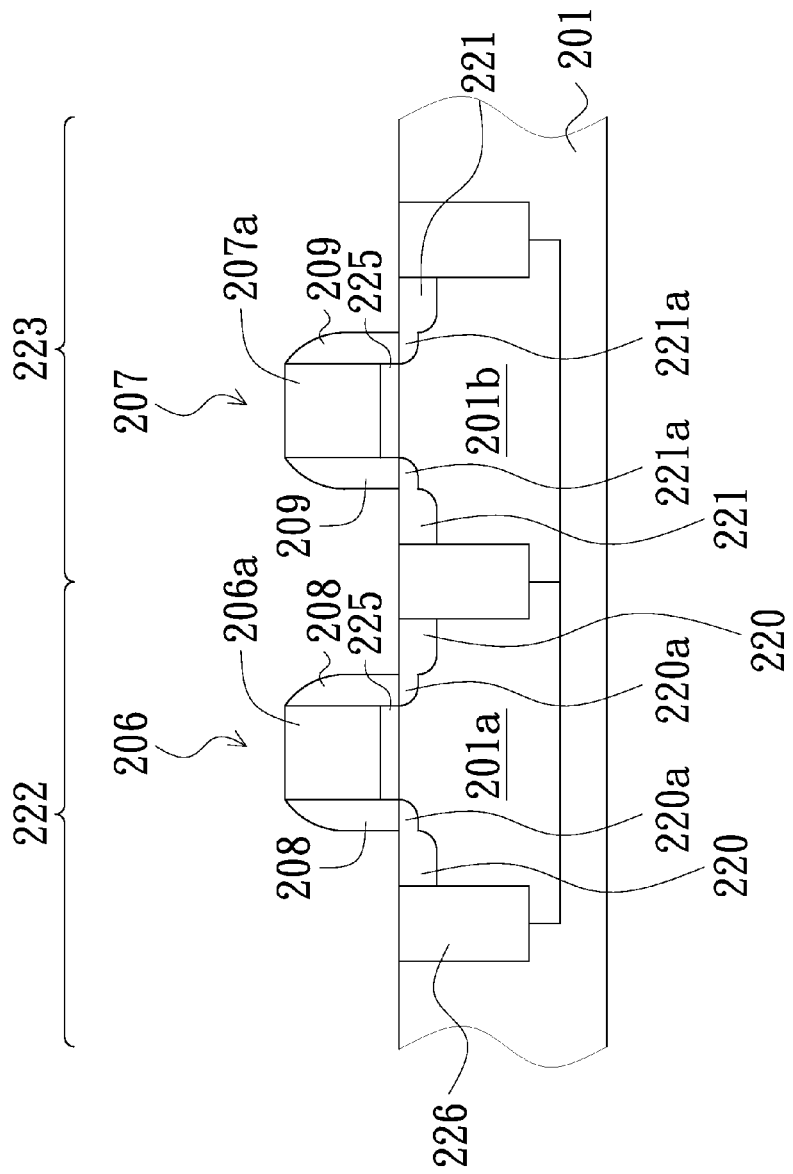
Figure 2C:
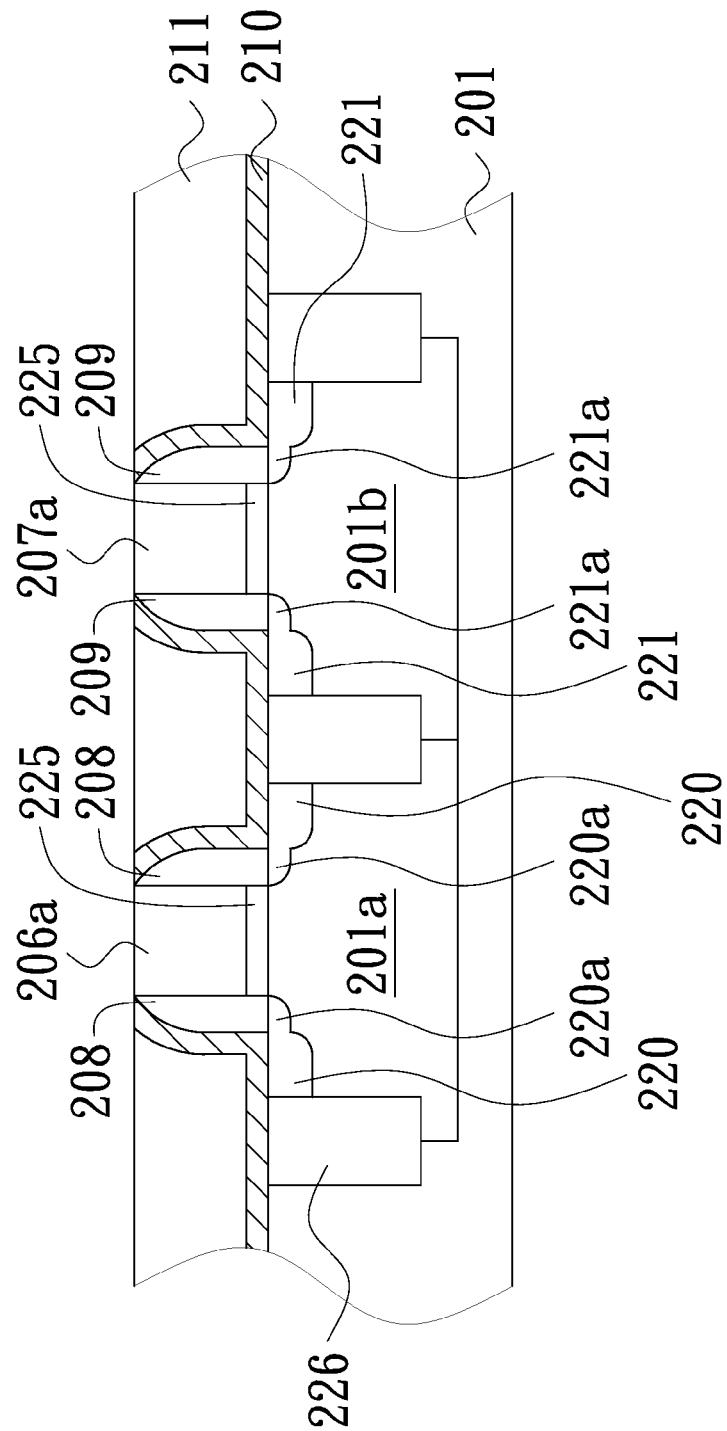

Subsequently, a contact etch stop layer (CESL) 210 and an interlayer dielectric (ILD) 211 are successively formed on the PMOS 222 and the NMOS 223, and then a series of chemical mechanical polishing (CMP) processes or etching processes are performed by using the CESL 210 as a mask to partially remove a portion of the CESL 210 and the ILD 211, thereby the dummy gate electrodes 206a and 207a are exposed (see FIG. 2C). In the present invention, the CESL 210 preferably is made of $SiO_2$, SiN, SiON or SiCN.

Figure 2D:
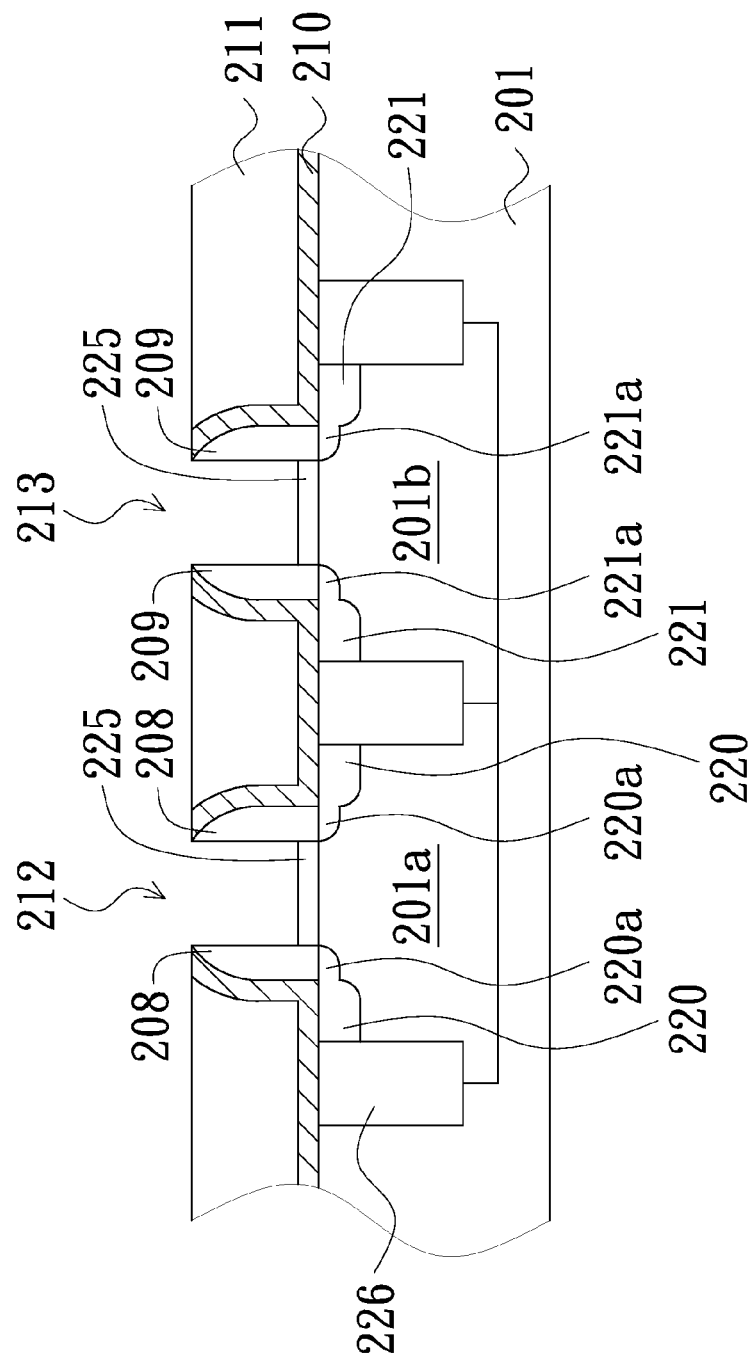
Figure 2E:
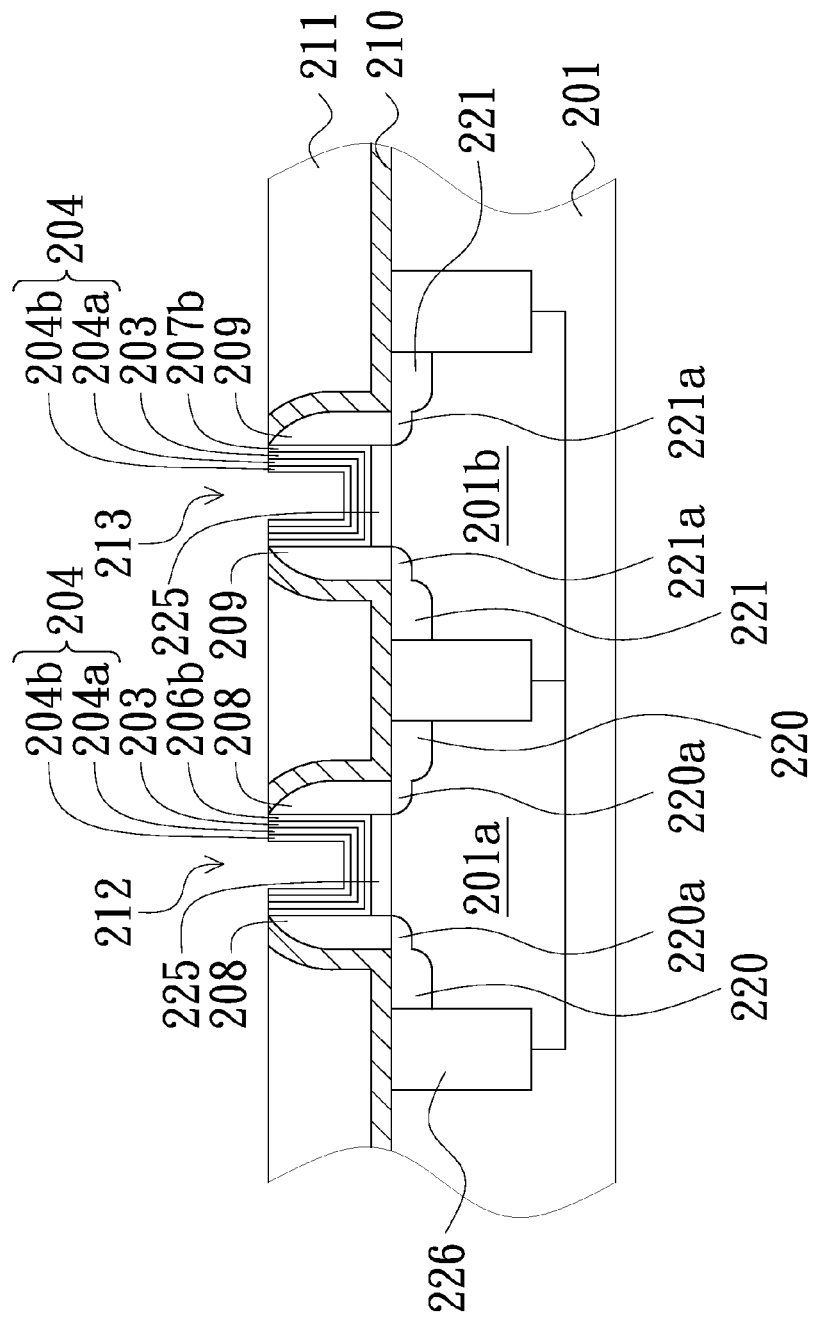

An etching process is then performed by using the patterned dielectric layer 225 as the etching stop layer to remove the dummy gate electrodes 206a and 207a and, whereby openings 212 and 213 are formed in the PMOS 222 and the NMOS 223 respectively, and the patterned dielectric layer 225 can be exposed there form (see FIG. 2D).

After that, a high-k dielectric layer, an optional capping layer 203 and a composite sacrificial layer 204 are deposited on the PMOS 222 and the NMOS 223. Subsequently, the high-k dielectric layer 202, the optional capping layer 203 and the composite sacrificial layer 204 are patterned, whereby the remaining portions of the high-k dielectric layer 202, the capping layer 203 and the composite sacrificial layer 204 are stacked on the location where the dummy gate electrode 206a and 207a are initially disposed.

In other words, the remaining portions of the high-k dielectric layer, the capping layer 203 and the composite sacrificial layer 204 are sequentially stacked on the exposed dielectric layer 225 and the sidewalls of the openings 212 and 213. In the present embodiment, the remaining portion of the high-k dielectric layer stacked on the bottom and the sidewalls of the opening 212 is referred as the high-k gate insulator layer 206b; and the remaining portion of the high-k dielectric layer stacked on the bottom and the sidewalls of the opening 213 is referred as the high-k gate insulator layer 207b (see FIG. 2E).

In the present embodiment, the high-k dielectric layer is preferably made of hafnium silicon, hafnium oxide, hafnium silicon oxide or hafnium silicon oxynitride. The capping layer 203 is preferably made of TiN. The composite sacrificial layer 204 comprises a silicon-containing sacrificial layer 204a and a metal nitride sacrificial layer 204b, wherein the silicon-containing sacrificial layer 204a is formed on the capping layer 203, and the metal nitride sacrificial layer 204b is formed on the silicon-containing sacrificial layer 204a. The silicon-containing sacrificial layer 204a can be a poly silicon layer, an amorphous silicon layer or a doped silicon layer and preferably is a thin film poly silicon layer. The metal nitride sacrificial layer 204b preferably is made of TiN or TaN.

Figure 2F:
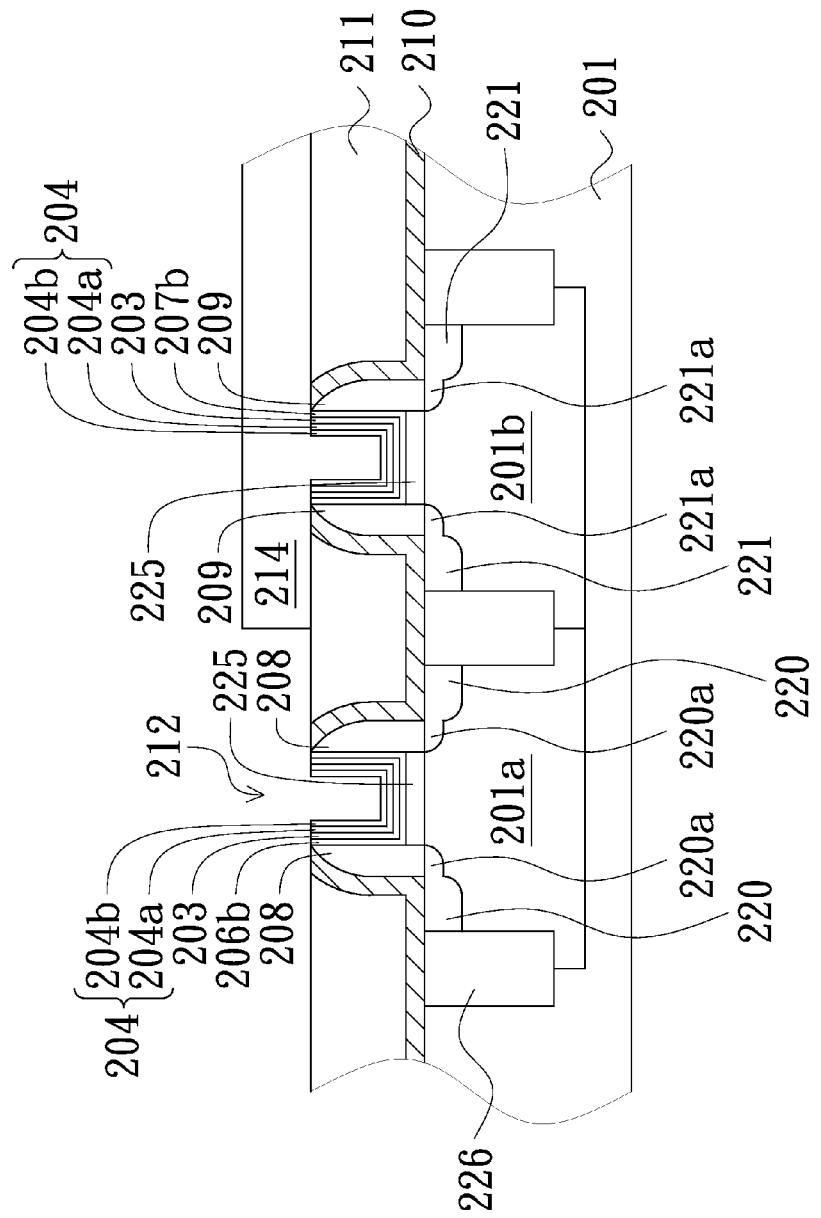
Figure 2G:
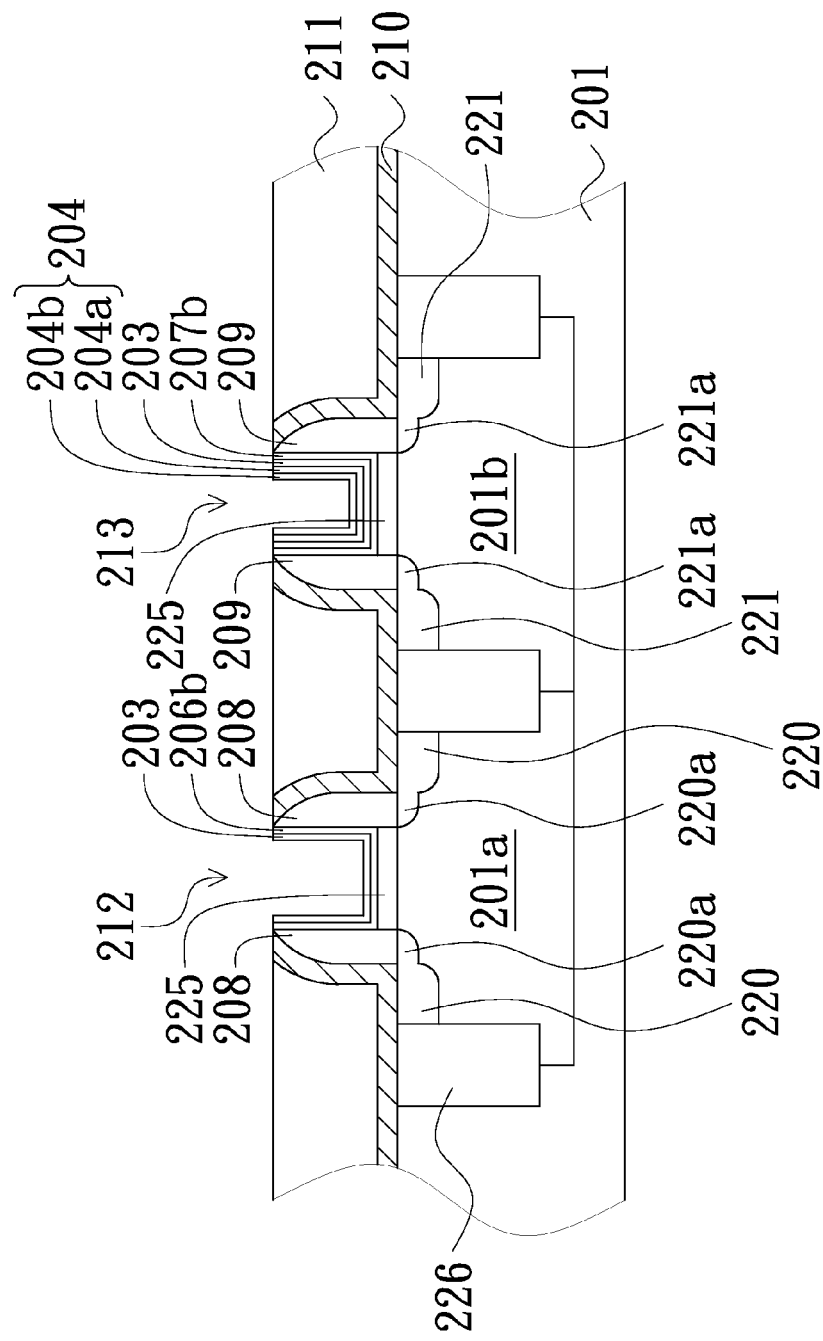

Subsequently, a patterned photo-resist layer 214 is formed to cover the portion of the metal nitride sacrificial layer 204b exposed by the opening 213 (see FIG. 2F). A wet etching process is then performed to remove a portion composite sacrificial layer 204 exposed from the opening 212 and the patterned photo-resist layer 214 (see FIG. 2G)

In some embodiment of the present invention, the wet etching process comprises steps as follows: Firstly an ammonia-containing agent (preferably is SC1 solution including $NH_4OH$, $H_2O_2$ and $H_2O$) is applied to remove the portion the patterned metal nitride sacrificial layer 204b exposed from the opening 212, whereby the portion of the silicon-containing sacrificial layer 204a overlaying the high-k insulator layer 206b is exposed from the opening 212. Subsequently, a photo-resist stripping agent (preferably is Rezi-38 solution) is applied to remove the patterned photo-resist layer 214, whereby the portion of the metal nitride sacrificial layer 204b overlaying on the high-k gate insulator layer 207b is exposed via the opening 213. A hydrogen chloride-containing agent (preferably is SC2 solution including HCl, $H_2O_2$ and $H_2O$) is then applied to remove the exposed portion of the silicon-containing sacrificial layer 204a, whereby the portion of the capping layer 203 overlaying on the first high-k insulator layer 206b is exposed from the opening 212.

However, since the capping layer 203 is optional, thus it should be appreciated that in some embodiments of the present invention, the high-k insulator layer 206b may be exposed from the opening 212, when the exposed portion of the silicon-containing sacrificial layer 204a is removed.

Figure 2H:
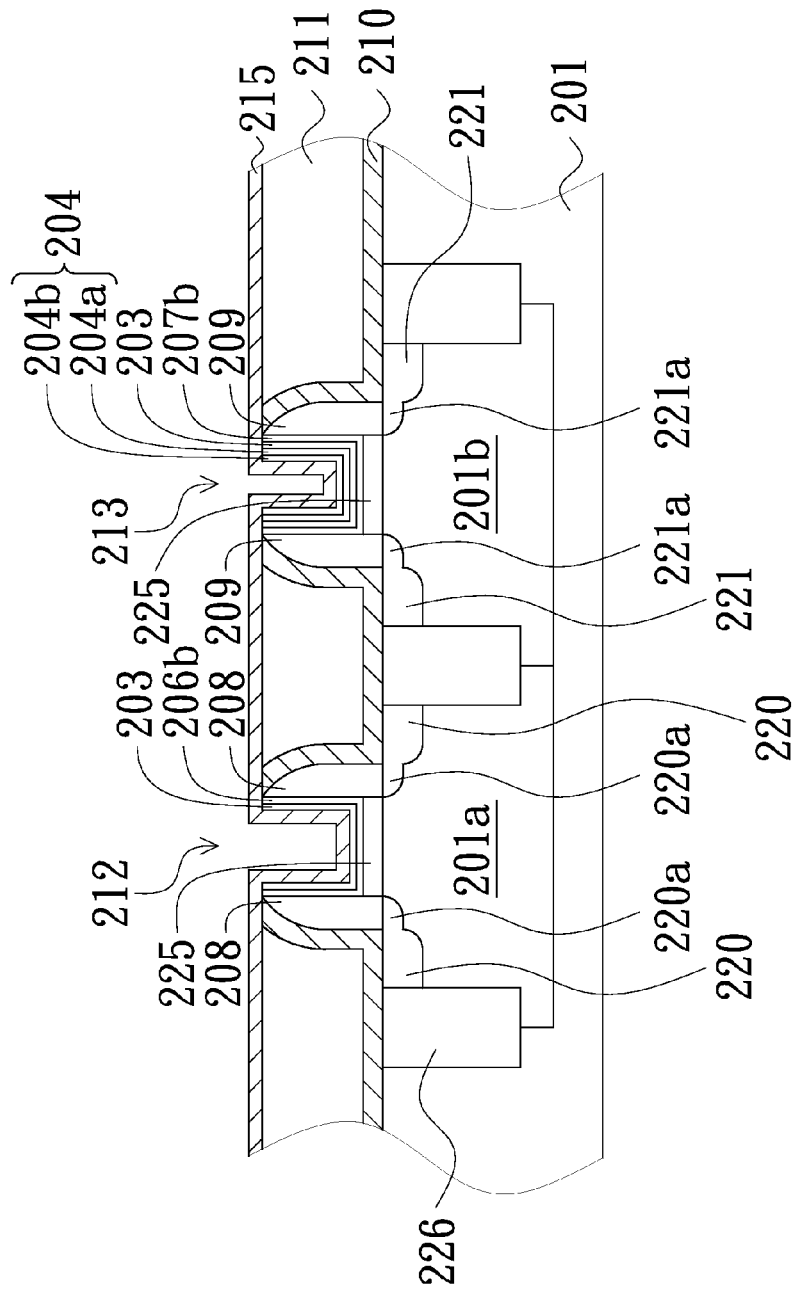
Figure 2I:
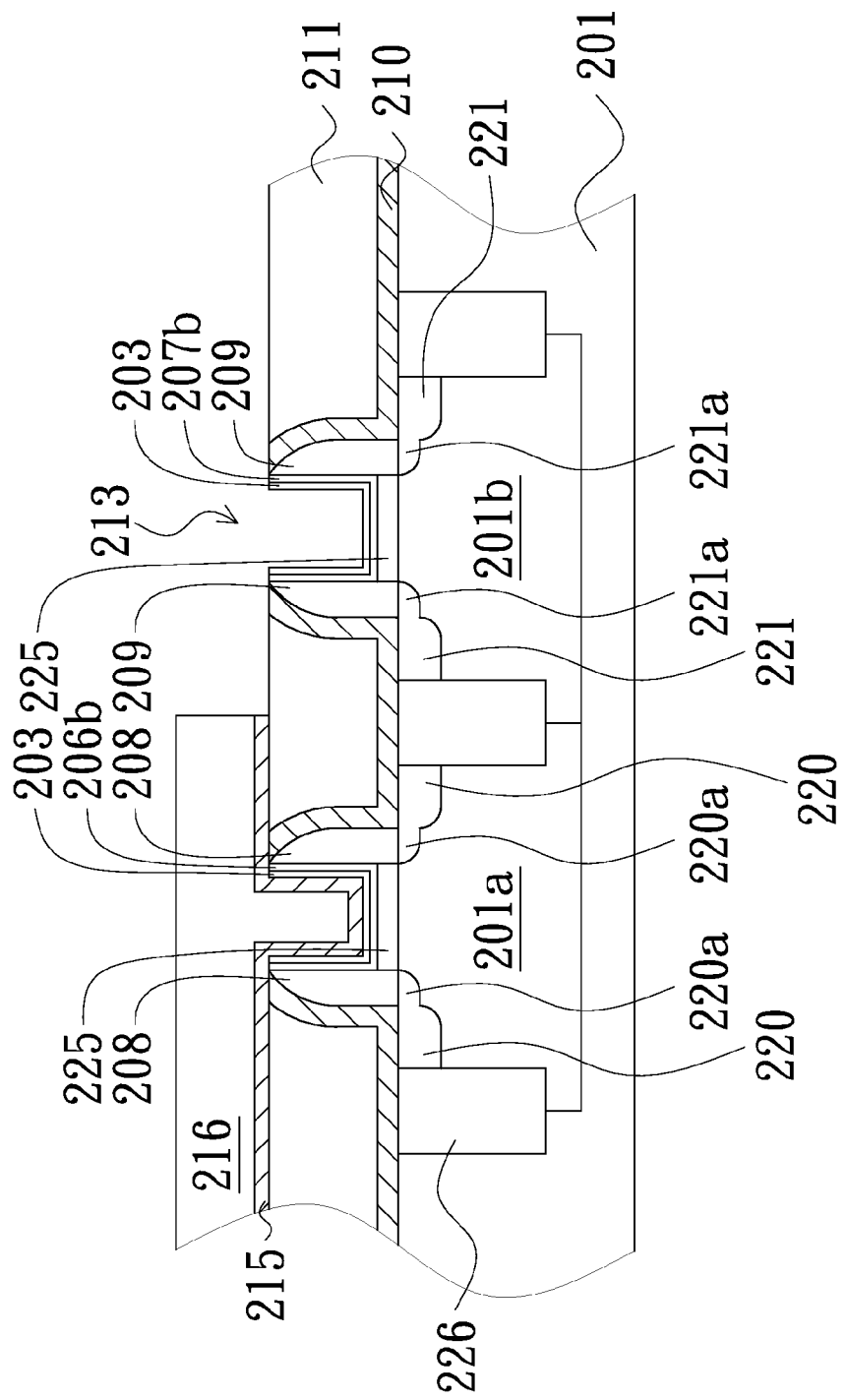

A metal deposition process is then performed to form a work-function layer 215 coving the bottom and the sidewalls of the openings 212 and 213, thereby the portion of the capping layer 203 exposed from the openings 212 and the portion of the metal nitride sacrificial layer 204b exposed from the openings 213 are blanketed by the work-function layer 215 (see FIG. 2H). In the present embodiment, the work-function layer 115 is suitable for serving as a PMOS work function layer or a mid-gate function layer, and preferably is a TiN layer.

After the work-function layer 215 is formed, another patterned photo-resist layer 216 is provided to cover the portion of the work function layer 215 which overlays on the high-k gate insulator layer 206b. Subsequently, an etching process is performed and stops at the capping layer 203 to remove the uncovered portion of the work function layer 215 and the portion of the composite sacrificial layer 204 beneath the uncovered portion of the work function layer 215, such that a portion of the capping layer 203 can be exposed from the opening 213 (see FIG. 2I).

After the patterned photo-resist layer 216 is stripped, another metal deposition process is then performed to form a work-function layer 217 covering the bottom and the sidewalls of the openings 212 and 213, whereby the remaining work function layer 215 and the portion of the capping layer 203 exposed from the opening 213 are blanketed by the work-function layer 217. In the present embodiment, the work-function layer 217 is suitable for serving as an NMOS work function layer or a mid-gate function layer, and preferably is an AlTi layer.

Figure 2J:
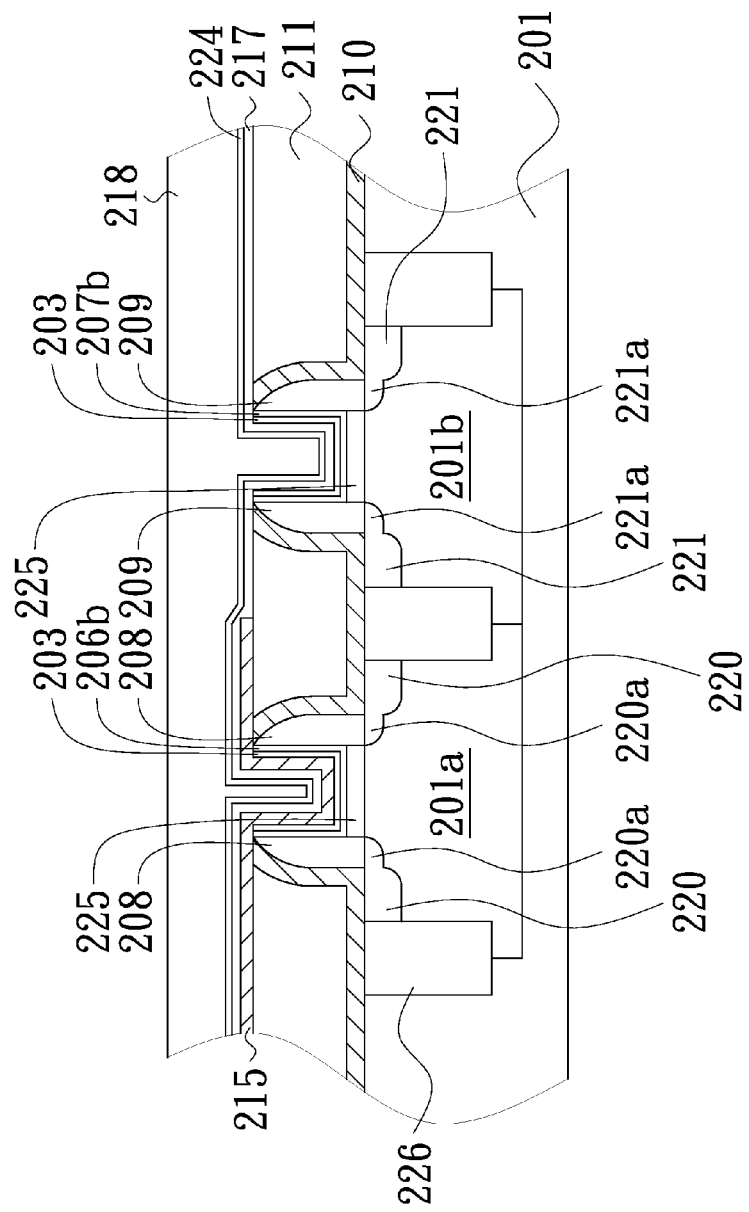
Figure 2K:
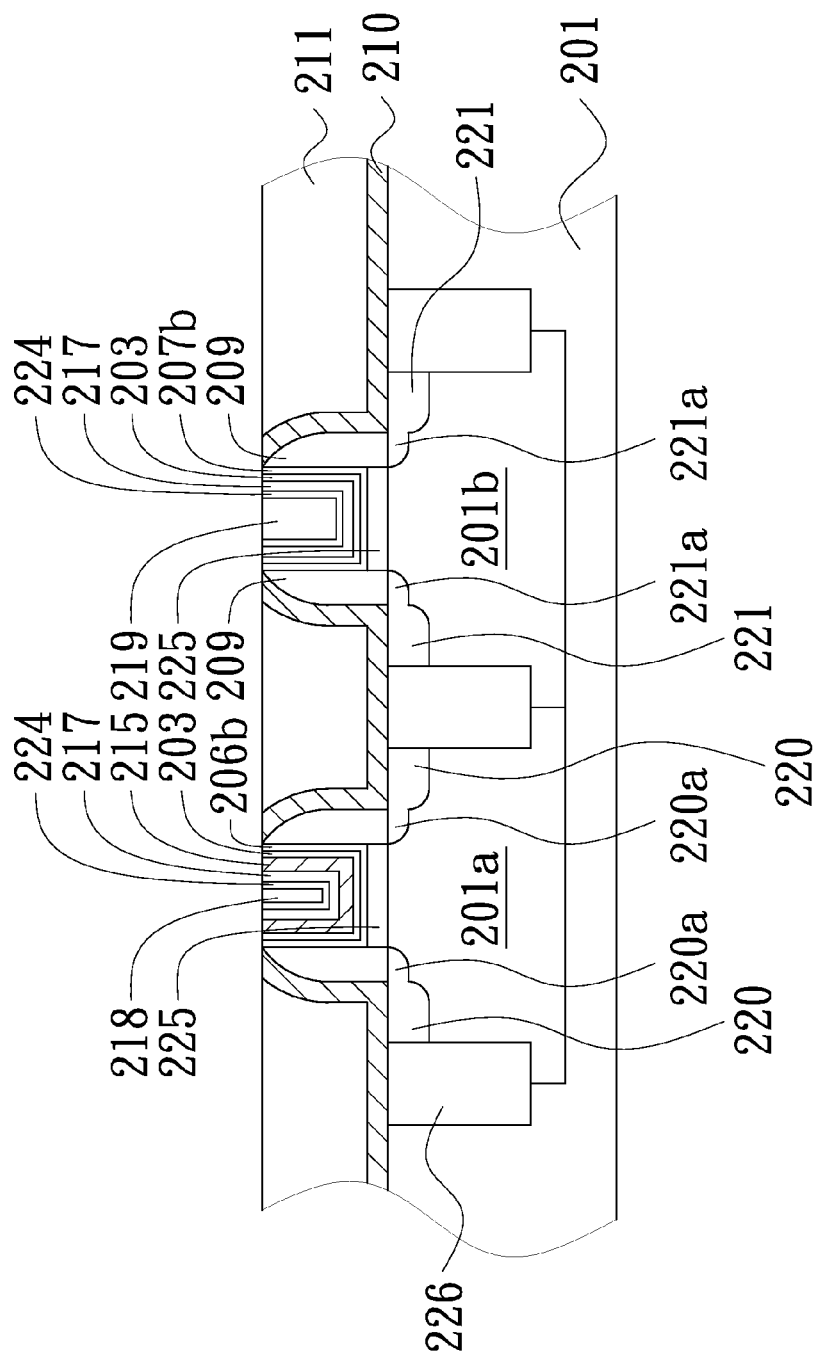

Next, an optional barrier metal layer 224 (such as a TiN film or other metal layer) and a low-resistivity metal layer 218 (consisting of copper or AlTi) are sequentially deposited on the work-function layer 217 and fills the openings 212 and 213(see FIG. 2J). The metal layer 218, the barrier metal layer 224, the work-function layer 217 and the remaining work function layer 215 are then subjected to a metal planarizaition process (such as a CMP process), thereby two metal gates electrodes 218 and 219 are produced, and meanwhile the metal gate CMOS transistor 200 shown as FIG. 2K is fabricated.

In accordance with the aforementioned embodiments of the present invention, a composite sacrificial layer formed on a high-k insulator layer is provided to take the place of a conventional TaN capping layer for fabricating a metal gate. The composite sacrificial layer not only can serve as an etching stop layer, like the conventional TaN capping layer does, to protect the high-k gate insulator layer of the NMOS from being damaged by an etching process, but also can be removed during the metal gate fabricating process. In other words, the composite sacrificial layer functions as the conventional TaN capping layer but does not contribute any adverse effect. Accordingly, the drawbacks and problems encountered from the prior art can be avoided, and the device performance can be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor device comprising:
   providing a first dummy gate having a first high-k gate insulator layer, a first composite sacrificial layer, and a first dummy gate electrode sequentially stacked on a substrate;
   providing a second dummy gate simultaneously with the provision of the first dummy gate, wherein the second dummy gate has a second high-k gate insulator layer, a second composite sacrificial layer, and a second dummy gate electrode sequentially stacked on the substrate;
   removing the first dummy gate electrode to expose the first composite sacrificial layer;
   removing the second dummy gate electrode simultaneously with the step of removing the first dummy gate electrode to expose the second composite sacrificial layer;
   forming a first patterned photo-resist layer to cover the exposed second composite sacrificial layer,
   removing the first composite sacrificial layer;
   forming a first work function layer on the first high-k gate insulator layer; and
   forming a first metal gate electrode on the first work function layer.

2. The method for fabricating the semiconductor device according to claim 1, wherein the formation of the first work function layer is carried out after the first patterned photo-resist, layer is removed such that exposed second composite sacrificial layer is covered by the first work function layer.

3. The method for fabricating the semiconductor device according to claim 2, further comprising:
   forming a second patterned photo-resist layer to cover a portion of the first work function layer which covers the first high-k gate insulator layer;

performing an etching process to remove portions of the first work function layer and the second composite sacrificial layer that are not covered by the second patterned photo-resist layer;

forming a second work function layer on the first high-k gate insulator layer and the second high-k gate insulator layer, after the second patterned photo-resist layer is removed; and forming a second metal gate electrode on the second work function layer simultaneously with the formation of the first metal gate electrode.

4. The method for fabricating the semiconductor device according to claim 3, wherein the first work function layer is made of titanium nitride (TiN); and the second work function layer is made of titanium-aluminum alloy (TiAl).

5. The method for fabricating the semiconductor device according to claim 1, wherein the first composite sacrificial, layer and the second composite sacrificial layer both comprise:

a patterned silicon-containing sacrificial layer, formed on the first high-k gate insulator layer and the second high-k gate insulator layer; and a patterned metal nitride sacrificial layer, formed on the patterned silicon-containing sacrificial layer.

6. The method for fabricating the semiconductor device according to claim 5, wherein the metal nitride sacrificial layer is made of TiN or tantalum nitride (TaN).

7. The method for fabricating the semiconductor device according to claim 5, wherein the first dummy gate and the second dummy gate further comprise a patterned TiN capping layer formed beneath the patterned silicon-containing sacrificial layer and over the first high-k gate insulator layer and the second high-k gate insulator layer.

8. The method for fabricating the semiconductor device according to claim 5, wherein the step of removing the first composite sacrificial layer comprises:

applying an ammonia-containing agent to remove a portion of the patterned metal nitride sacrificial layer, such that a portion of the patterned silicon-containing sacrificial layer that overlies the first high-k gate insulator layer is exposed; and applying a chloride-containing agent to remove the exposed portion of the patterned silicon-containing sacrificial layer.

9. The method for fabricating the semiconductor device according to claim 1, further comprising steps of using the first dummy gate and the second dummy gate as a mask to form a first source/drain structure and a second source/drain structure in the substrate adjacent to the first dummy gate structure and the second dummy gate structure, respectively.

10. A method for fabricating a complementary metal-oxide semiconductor (CMOS) transistor comprising:

providing a first dummy gate having a first high-k gate insulator layer, a first composite sacrificial layer, and a first dummy gate electrode sequentially stacked on an N well region of a substrate;

providing a second dummy gate simultaneously with the provision of the first dummy gate, wherein the second dummy gate has a second high-k gate insulator layer, a second composite sacrificial layer, and a second dummy gate electrode sequentially stacked on a P well region of the substrate;

removing the first dummy gate electrode and the second dummy gate electrode to expose the first composite sacrificial layer and the second composite sacrificial layer;

forming a first patterned photo-resist layer to cover the exposed second composite sacrificial layer;

removing the first composite sacrificial layer to expose the first high-k gate insulator layer;

forming a first work function layer on the first high-k gate insulator layer and the exposed second composite sacrificial layer, after the first patterned photo-resist layer is removed;

forming a second patterned photo-resist layer to cover a portion of the first work function layer which covers the first high-k gate insulator layer;

performing an etching process to remove portions of the first work function layer and the second composite sacrificial layer that are not covered by the second patterned photo-resist layer;

forming a second work function layer on the first high-k gate insulator layer and the second high-k gate insulator layer, after the second patterned photo-resist layer is removed;

forming a first metal gate electrode on the first work function layer; and forming a second metal gate electrode on the second work function layer simultaneously with the formation of the first metal gate electrode.

* * * * *